United States Patent
Jung et al.

(10) Patent No.: US 12,332,071 B2
(45) Date of Patent: Jun. 17, 2025

(54) INFORMATION PROCESSING APPARATUS, INFORMATION PROCESSING METHOD, AND AUDIO PROCESSING DEVICE

(71) Applicant: SONY GROUP CORPORATION, Tokyo (JP)

(72) Inventors: Myungjin Jung, Tokyo (JP); Takuro Yamamoto, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 281 days.

(21) Appl. No.: 17/998,178

(22) PCT Filed: May 13, 2021

(86) PCT No.: PCT/JP2021/018268
§ 371 (c)(1),
(2) Date: Nov. 8, 2022

(87) PCT Pub. No.: WO2021/235321
PCT Pub. Date: Nov. 25, 2021

(65) Prior Publication Data
US 2023/0273036 A1 Aug. 31, 2023

(30) Foreign Application Priority Data
May 21, 2020 (JP) .................... 2020-088624

(51) Int. Cl.
- *G01C 21/36* (2006.01)
- *G01S 5/22* (2006.01)
- *G06F 3/16* (2006.01)

(52) U.S. Cl.
CPC ............ *G01C 21/3629* (2013.01); *G01S 5/22* (2013.01); *G06F 3/165* (2013.01); *G06F 3/167* (2013.01)

(58) Field of Classification Search
CPC ....... G01C 21/3629; G01S 5/22; G06F 3/165; G06F 3/167
See application file for complete search history.

(56) References Cited

U.S. PATENT DOCUMENTS

| 5,959,568 A | * | 9/1999 | Woolley | G01S 13/878 340/568.1 |
| 6,401,028 B1 | * | 6/2002 | Kamiya | G01C 21/36 340/995.19 |

(Continued)

FOREIGN PATENT DOCUMENTS

| JP | 07-046069 A | 2/1995 |
| JP | 2004-320582 A | 11/2004 |

(Continued)

OTHER PUBLICATIONS

International Search Report and Written Opinion of PCT Application No. PCT/JP2021/018268, issued on Jul. 27, 2021, 11 pages of ISRWO.

*Primary Examiner* — Gertrude Arthur Jeanglaude
(74) *Attorney, Agent, or Firm* — CHIP LAW GROUP

(57) ABSTRACT

An information processing apparatus includes an acquisition unit configured to acquire information regarding at least one candidate location, a generation unit configured to generate sound data for expressing a sense of distance from a current location of a user to the candidate location acquired by the acquisition unit using a plurality of sound sources, and an output unit configured to output the sound data generated by the generation unit to the plurality of sound sources.

25 Claims, 25 Drawing Sheets

(56) References Cited

U.S. PATENT DOCUMENTS

| | | | | |
|---|---|---|---|---|
| 2006/0008117 | A1* | 1/2006 | Kanada | H04S 7/302 |
| | | | | 382/103 |
| 2014/0279101 | A1* | 9/2014 | Duplan | G06Q 20/40 |
| | | | | 705/18 |
| 2018/0139565 | A1* | 5/2018 | Norris | H04S 1/007 |
| 2020/0230494 | A1* | 7/2020 | Gotoh | G01C 21/26 |

FOREIGN PATENT DOCUMENTS

| | | |
|---|---|---|
| JP | 2014-016290 A | 1/2014 |
| JP | 2016-058798 A | 4/2016 |
| JP | 2017-138277 A | 8/2017 |
| JP | 2017-173134 A | 9/2017 |
| WO | 2018/186178 A1 | 10/2018 |

\* cited by examiner

FIG.2

RESTAURANT

Main: NAVIGATION SOUND
Sub: BGM

Main: COOKING SOUNDS (STIR-FRIED FOOD, DEEP-FRIED FOOD)
Sub: SOUND OF FOOTSTEPS

AMUSEMENT PARK (THEME PARK)

Main: VOICE OF MAIN CHARACTER IN MOVIE AA
Sub: BGM

Main: MUSIC OF PARADE
Sub: SOUND OF CROWD

AMUSEMENT FACILITY (ENTERTAINMENT)

Main: TARGET SOUND
Sub: OTHER SOUNDS

ART GALLERY/MUSEUM

Main: AUDIO DESCRIPTION OF EXHIBIT
Sub: BGM

ZOO/AQUARIUM

Main: SIMULATED PANDA
Sub: SOUND OF OWN FOOTSTEPS/BARKING OF ANOTHER ANIMAL

FIG.3
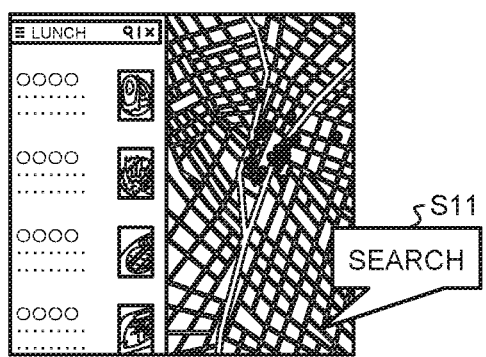
S11 SEARCH
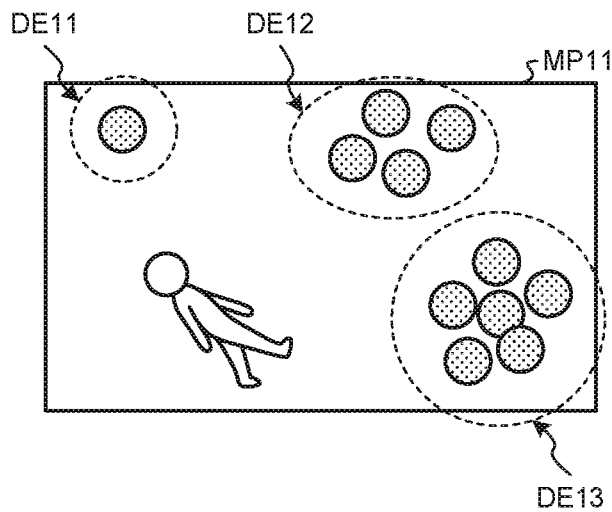
DE11 DE12 MP11
DE13
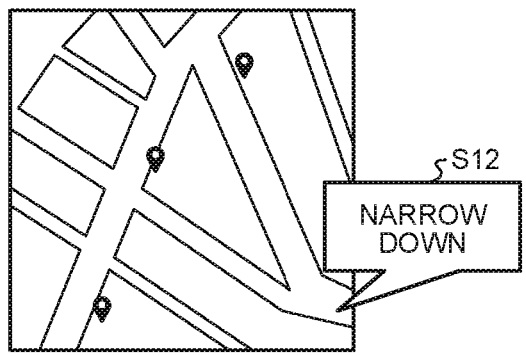
S12 NARROW DOWN
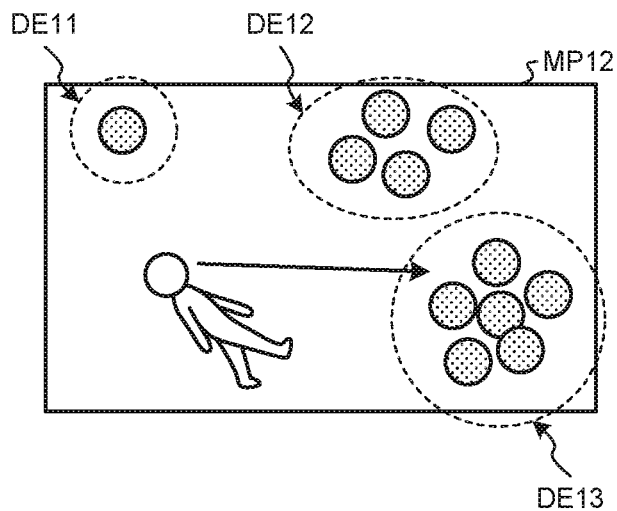
DE11 DE12 MP12
DE13
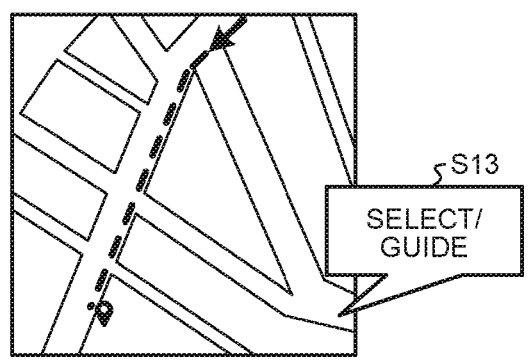
S13 SELECT/GUIDE
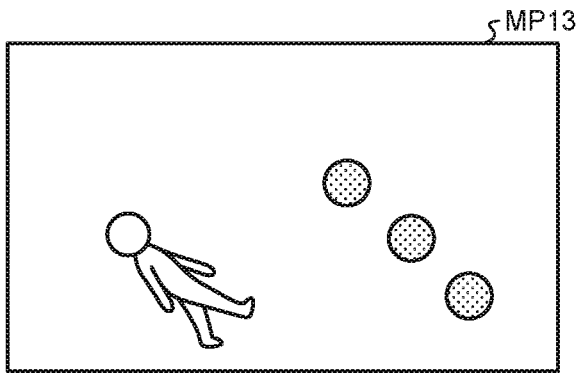
MP13

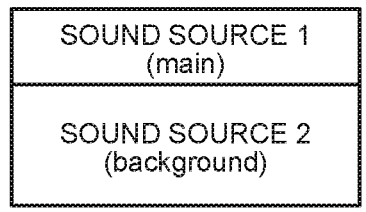
FIG. 6A
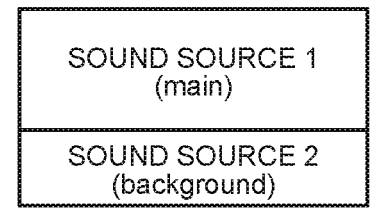
FIG. 6B
FIG. 7A
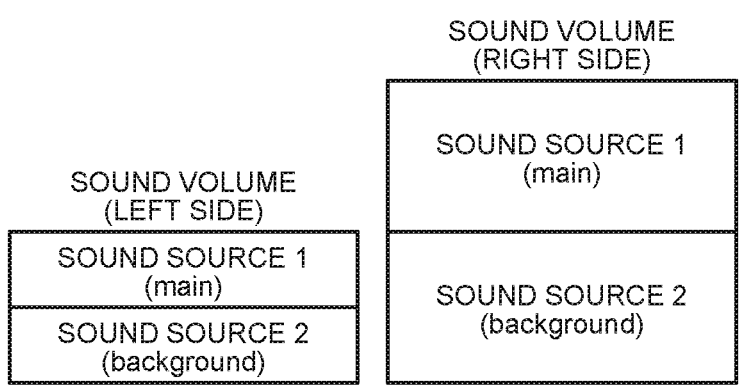
FIG. 7B
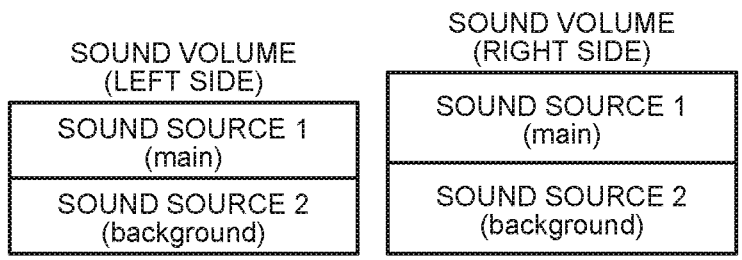

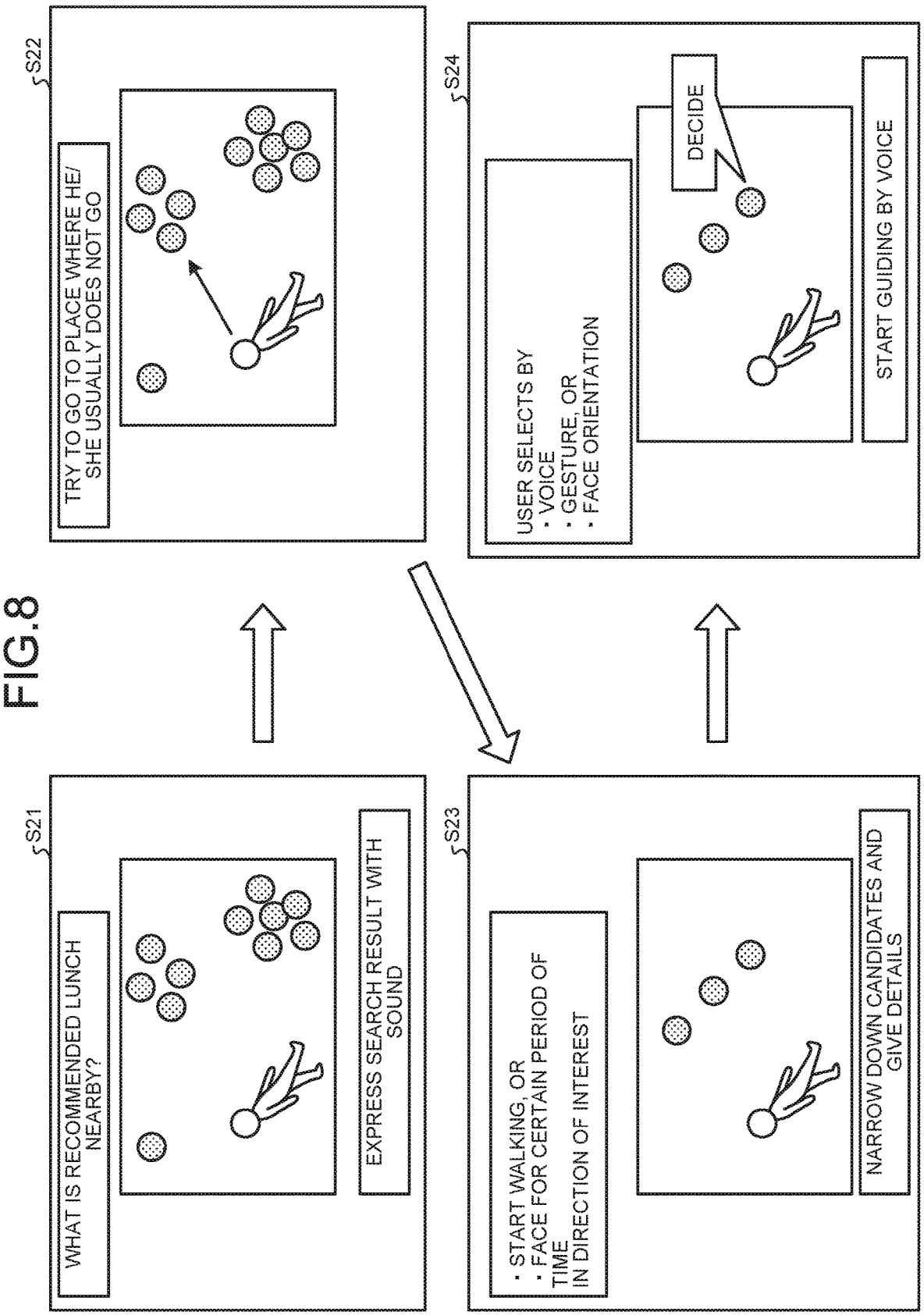

FIG.19

| SOUND SOURCE ID | CANDIDATE LOCATION ATTRIBUTE | FIRST SOUND SOURCE | SECOND SOUND SOURCE | ... |
|---|---|---|---|---|
| MU11 | RESTAURANT | NAVIGATION SOUND | BGM | ... |
| MU12 | AMUSEMENT PARK | MUSIC OF PARADE | SOUND OF CROWD | ... |
| ... | ... | ... | ... | ... |

INFORMATION PROCESSING APPARATUS, INFORMATION PROCESSING METHOD, AND AUDIO PROCESSING DEVICE

CROSS REFERENCE TO RELATED APPLICATIONS

This application is a U.S. National Phase of International Patent Application No. PCT/JP2021/018268 filed on May 13, 2021, which claims priority benefit of Japanese Patent Application No. JP 2020-088624 filed in the Japan Patent Office on May 21, 2020. Each of the above-referenced applications is hereby incorporated herein by reference in its entirety.

FIELD

The present disclosure relates to an information processing apparatus, an information processing method, an information processing program, and an audio processing device.

BACKGROUND

In recent years, there has been widespread development of techniques for expressing (feeding back) a sense of distance and a sense of orientation with sound (for example, music) according to a distance and an orientation from a current position (current location) of a user to a specific position. This technique is called, for example, audio AR, sound AR (Augmented Reality), or the like.

CITATION LIST

Patent Literature

Patent Literature 1: JP 2017-138277 A

SUMMARY

Technical Problem

However, in conventional techniques, there is room for promoting further improvement in usability. For example, in conventional techniques, there is a case where a sense of distance to a specific position and a sense of orientation cannot be appropriately expressed, and thus there is room for promoting further improvement in usability.

Therefore, the present disclosure proposes a new and improved information processing apparatus, information processing method, information processing program, and audio processing device capable of promoting further improvement in usability.

Solution to Problem

According to the present disclosure, an information processing apparatus includes: an acquisition unit configured to acquire information regarding at least one candidate location; a generation unit configured to generate sound data for expressing a sense of distance from a current location of a user to the candidate location acquired by the acquisition unit using a plurality of sound sources; and an output unit configured to output the sound data generated by the generation unit to the plurality of sound sources.

BRIEF DESCRIPTION OF DRAWINGS

FIG. 2 is a diagram illustrating examples of sound sources according to the embodiment.

FIG. 3 is a diagram illustrating an outline of the information processing system according to the embodiment.

FIGS. 6A and 6B are diagrams illustrating ratios of sound volumes of sound sources for expressing a sense of distance according to the embodiment.

FIGS. 7A and 7B are diagrams illustrating sound volumes of right and left sound sources for expressing a sense of orientation according to the embodiment.

FIG. 8 is a diagram illustrating an example of a use case (restaurant) using the information processing system according to the embodiment.

FIG. 19 is a diagram illustrating an example of a storage unit according to the embodiment.

DESCRIPTION OF EMBODIMENTS

Figure 1:
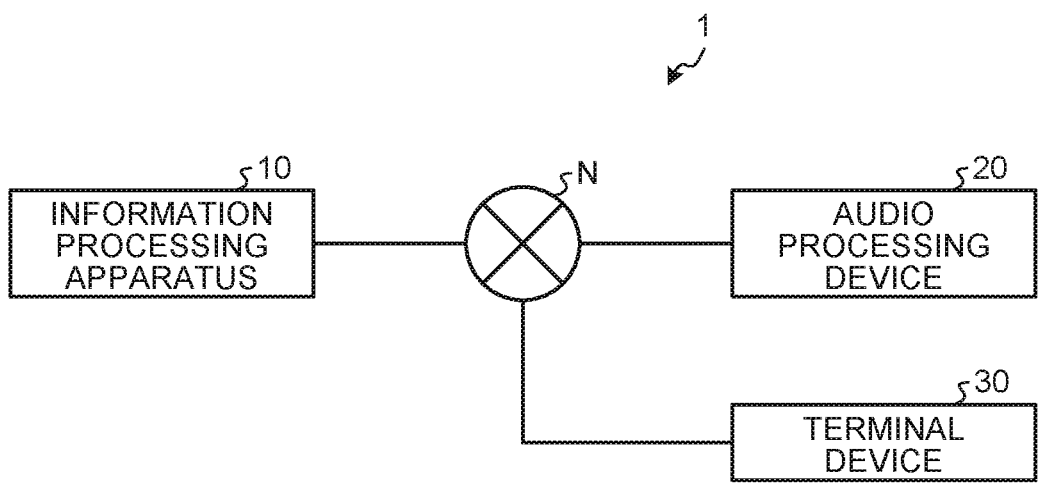
FIG. 1 is a diagram illustrating a configuration example of an information processing system according to an embodiment.

Hereinafter, preferred embodiments of the present disclosure will be described in detail with reference to the accompanying drawings. Note that, in the present specification and the drawings, components having substantially the same functional configurations are denoted by the same reference numerals, and redundant description is omitted.

Note that the description will be given in the following order.

1. Embodiment of Present Disclosure
1.1. Introduction
1.2. Configuration of Information Processing System
2. Functions of Information Processing System
2.1. Outline of Function: Expressing Density with Sound
2.2. Outline of Function: Expressing Sense of Distance and Sense of Orientation with Sound
2.3. Use Case
2.4. Functional Configuration Example
2.5. Processing of Information Processing System
2.6. Processes of Use Cases
2.7. Variations of Processing
3. Hardware Configuration Example
4. Summary

1. Embodiment of the Present Disclosure

1.1. Introduction

There has been widespread development of techniques for expressing a sense of distance and a sense of orientation from a current location of a user to a specific position with sound. As an example of a method of expressing the sense of distance with sound, there is a method of making the sound volume proportional to the distance. However, when the sound volume is proportional to the distance, the sound may excessively change according to the distance. In this case, the sound may not be heard as soon as the distance becomes slightly longer. Meanwhile, if adjustment is made so that the amount of change in sound according to the distance is reduced, it may be difficult to express the sense of distance with sound.

In relation to the above technique, there is known a technique for adjusting a spread of a sound field according to a distance from a current location of a user to a specific position (Patent Literature 1). For example, in Patent Literature 1, a spread of a sound field is adjusted by deciding sound characteristics using sound localization processing. However, this technique may not be able to express the sense of distance with high accuracy. Therefore, there is room for promoting further improvement in usability.

Therefore, the present disclosure proposes a new and improved information processing apparatus, information processing method, information processing program, and audio processing device capable of promoting further improvement in usability.

1.2. Configuration of Information Processing System

A configuration of an information processing system 1 according to an embodiment will be described. FIG. 1 is a diagram illustrating a configuration example of the information processing system 1. As illustrated in FIG. 1, the information processing system 1 includes an information processing apparatus 10, an audio processing device 20, and a terminal device 30. Various devices can be connected to the information processing apparatus 10. For example, the audio processing device 20 and the terminal device 30 are connected to the information processing apparatus 10, and information cooperation is performed between the devices. The information processing apparatus 10, the audio processing device 20, and the terminal device 30 are connected to an information communication network by wireless or wired communication so as to mutually perform information/data communication and operate in cooperation. The information communication network may include the Internet, a home network, an Internet of Things (IoT) network, a Peer-to-Peer (P2P) network, a proximity communication mesh network, and the like. The wireless communication can use, for example, Wi-Fi, Bluetooth (registered trademark), or techniques based on a mobile communication standard such as 4G or 5G. The wired communication can use power line communication techniques such as Ethernet (registered trademark) or PLC (Power Line Communications).

The information processing apparatus 10, the audio processing device 20, and the terminal device 30 may be separately provided as a plurality of computer hardware devices on so-called on-premise, an edge server, or a cloud, or functions of a plurality of arbitrary devices of the information processing apparatus 10, the audio processing device 20, and the terminal device 30 may be provided as a same apparatus. Furthermore, the user can mutually perform information/data communication between the information processing apparatus 10, the audio processing device, and the terminal device 30 via a user interface (including a graphical user interface: GUI) and software (including computer programs (hereinafter, also referred to as programs)) operating on a terminal device (personal device such as a personal computer (PC) or a smartphone including a display as an information display device, and voice and keyboard input) not illustrated.

(1) Information Processing Apparatus 10

The information processing apparatus 10 is an information processing apparatus that performs processing for expressing a sense of distance from a current location of a user to a candidate location that can be a destination using a plurality of sound sources. Specifically, the information processing apparatus 10 acquires information regarding a candidate location that can be a destination of the user. Then, the information processing apparatus 10 generates sound data for expressing a sense of distance from the current location of the user to a candidate location that can be a destination using a plurality of sound sources. As a result, the information processing apparatus 10 is characterized by expressing the sense of distance to the candidate location by adjusting the plurality of sound sources, so that the accuracy of the sense of distance provided to the user can be improved.

Furthermore, the information processing apparatus 10 also has a function of controlling the overall operation of the information processing system 1. For example, the information processing apparatus 10 controls the overall operation of the information processing system 1 based on information cooperated between the devices. Specifically, the information processing apparatus 10 acquires information regarding a candidate location that can be a destination of the user based on the information received from the terminal device 30. Furthermore, the information processing apparatus 10 transmits information for outputting sound based on the sense of distance to the candidate location to the audio processing device 20.

The information processing apparatus 10 is implemented by a personal computer (PC), a server (Server), or the like. Note that the information processing apparatus 10 is not limited to a PC, a server, or the like. For example, the information processing apparatus 10 may be a computer hardware device such as a PC or a server in which functions as the information processing apparatus 10 are implemented as applications.

(2) Audio Processing Device 20

The audio processing device 20 is a member used by a user to listen to sound such as an earphone. The audio processing device 20 may be any member as long as the member includes a speaker that outputs sound. The audio processing device 20 is, for example, an earphone, an earpiece, an earpad, an ear mold, a headphone, or the like.

When sound information is received from an external information processing apparatus, the audio processing device 20 converts the received sound information into sound and outputs the sound from the speaker.

(3) Terminal Device 30

The terminal device 30 is an information processing apparatus used by a user. The terminal device 30 may be any device as long as the processing according to the embodiment can be implemented. Furthermore, the terminal device 30 may be a device such as a smartphone, a tablet terminal, a notebook PC, a desktop PC, a mobile phone, or a PDA.

2. Functions of Information Processing System

The configuration of the information processing system 1 has been described above. Next, functions of the information processing system 1 will be described. Note that the functions of the information processing system 1 include a function for expressing the density of candidate locations that can be the destination of the user with sound, and a function for expressing the sense of distance and the sense of orientation of the candidate locations with sound. Hereinafter, the two types of functions of the information processing system 1 will be described.

The plurality of sound sources according to the embodiment includes a first sound source prescribed in advance as a main sound source and a second sound source prescribed in advance as a background sound source based on the attribute of the candidate location. Each of the first sound source and the second sound source according to the embodiment is not limited to sound or acoustic sound, and may be a sound source of any sound. For example, each of the first sound source and the second sound source according to the embodiment may be background music (BGM) or a sound effect. Note that the second sound source may be a sound source selected to be a sound source suitable for the first sound source. For example, the second sound source may be a sound source selected from options prescribed in advance so as not to obstruct the first sound source. Furthermore, for example, the second sound source may be a sound source selected to have a lower priority than the first sound source. Here, the first sound source is the main sound source and the second sound source is the background sound source, but the opposite may be applied. For example, the second sound source may be set to have a higher priority than the first sound source.

FIG. 2 is a diagram illustrating examples of each of the first sound source and the second sound source. FIG. 2 illustrates, as an example, a case where the attribute of the candidate location is a restaurant (for example, a convenience store), an amusement park (theme park), an amusement facility (entertainment), and an art gallery, a museum, a zoo, or an aquarium. In a case where the attribute of the candidate location is a restaurant, for example, the first sound source is a navigation sound that guides a route to the restaurant, and the second sound source is a BGM. Note that the BGM of the second sound source may be a sound source selected to be suitable for the navigation sound. For example, the BGM of the second sound source may be a sound source selected not to disturb the navigation sound. As another example, in a case where the attribute of the candidate location is a restaurant, for example, the first sound source is sound of cooking (for example, sound of cooking stir-fried or deep-fried food), and the second sound source is the sound of footsteps. Next, in a case where the attribute of the candidate location is an amusement park, for example, the first sound source is the voice of the main character appearing in the movie AA, and the second sound source is the BGM. As another example, in a case where the attribute of the candidate location is an amusement park, for example, the first sound source is music of a parade, and the second sound source is the sound of a crowd. Next, in a case where the attribute of the candidate location is an amusement facility, for example, the first sound source is sound of a target attraction (for example, sound when a scream machine moves at a high speed or sound of people screaming), and the second sound source is sound of an attraction other than the target attraction. Next, in a case where the attribute of the candidate location is an art gallery or a museum, for example, the first sound source is a guidance sound for describing an exhibit, and the second sound source is a BGM. As another example, in a case where the attribute of the candidate location is a zoo or an aquarium, for example, the first sound source is simulated barking of the panda, and the second sound source is sound of user's own footsteps or barking of another animal. Note that the examples illustrated in FIG. 2 are examples, and the present invention is not limited to these examples.

2.1. Outline of Function: Expressing Density with Sound

In a case where a plurality of candidate locations is searched when a user searches for surrounding information, there is a case where it is desired to quickly grasp how many candidate locations are distributed in which direction from the position of the user. Hereinafter, in the embodiment, the information processing system 1 performs processing of providing the density (distribution) of candidate locations to the user. Then, the information processing system 1 performs processing of guiding the user to a direction in which the density is higher to narrow down candidate locations. For example, when the user moves the neck (head) and points in a direction with a line of sight, the information processing system 1 performs processing of increasing the tempo of the sound in a direction in which the density of candidate locations is higher and decreasing (loosening) the tempo of the sound in a direction in which the density of candidate locations is lower. Note that the predetermined range for deciding the density may be prescribed in any manner. For example, the predetermined range for deciding the density may be uniformly prescribed in advance, or may be prescribed for each density according to the bias of candidate locations.

FIG. 3 is a diagram illustrating an outline of a function for expressing the density of candidate locations that can be a destination of a user with sound. The information processing system 1 performs processing for expressing a plurality of candidate locations that can be a destination of the user with sound (S11). Specifically, the information processing system 1 first searches for a plurality of candidate locations that can be the destination of the user. Then, the information processing system 1 performs processing for expressing the density of the plurality of candidate locations included in the line-of-sight direction of the user with sound based on the search result. The information processing system 1 performs processing for decreasing the tempo of sound in a direction in which the density of candidate locations is lower. For example, since the density of the density DE11 is the lowest in the map MP11, the information processing system 1 performs processing for making the tempo of the sound in the direction of the density DE11 slower than in other directions. Meanwhile, the information processing system 1 performs processing for increasing the tempo of the sound in a direction in which the density of candidate locations is higher. For example, since the density of the density DE13 is the highest in the map MP11, the information processing system 1 performs processing for making the tempo of the sound in the direction of the density DE13 faster than in other directions. In this manner, the information processing system 1 decides the sound localization according to the density of candidate locations, thereby controlling the output sound. Next, the information processing system 1 selects a candidate location group including a plurality of candidate locations by the user's voice, gesture (for example, gestures indicating YES and NO), or line-of-sight direction (S12). In the map MP12, the information processing system 1 selects the density DE13. Then, the information processing system 1 repeats the processing of steps S11 and S12 until the number of candidate locations that can be the destination of the user after the processing of step S12 becomes equal to or less than a predetermined threshold. Then, in a case where the number of candidate locations that can be the destination of the user after the processing of step S12 is equal to or less than a predetermined threshold, the information processing system 1 selects one candidate location from the candidate locations and performs processing for guiding the user to the candidate location (S13).

Figure 4:
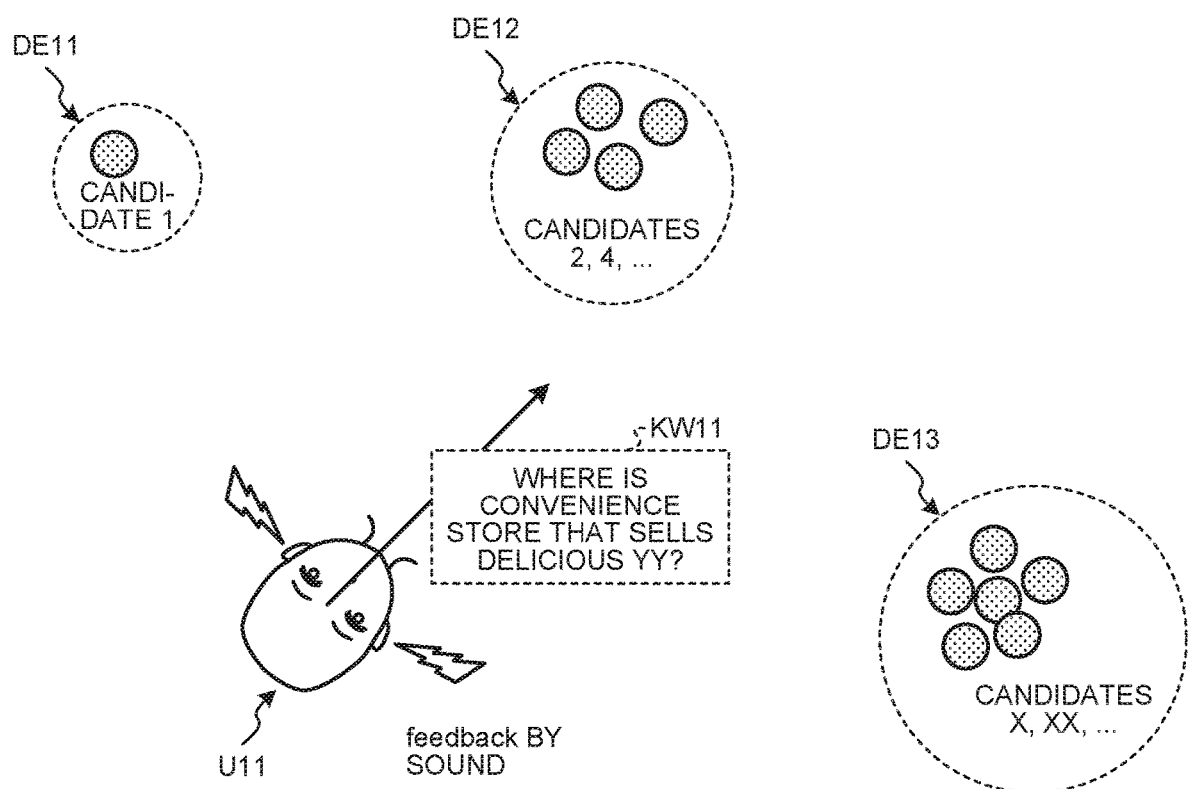
FIG. 4 is a diagram illustrating an outline of the information processing system according to the embodiment.

FIG. 4 illustrates an outline of processing for expressing the density of a plurality of candidate locations included in a line-of-sight direction of a user U11 with sound. The user U11 performs search KW11 via the terminal device 30. The information processing system 1 decides the density of candidate locations that can be the destination of the user U11 based on the search KW11. Then, when the user U11 directs his/her line of sight in the direction of the density DE12, for example, the information processing system 1 performs processing for expressing the density of candidate locations included in the line-of-sight direction with sound.

Figure 5:
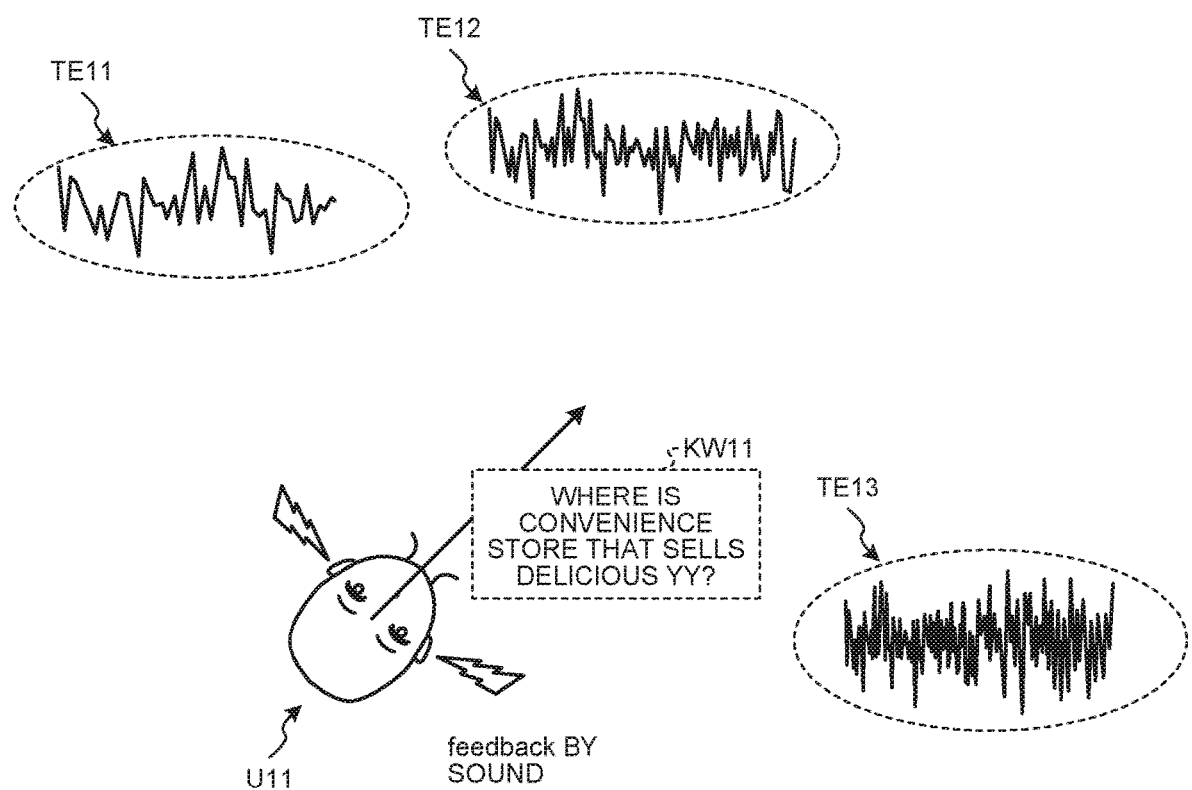
FIG. 5 is a diagram illustrating an outline of the information processing system according to the embodiment.

FIG. 5 illustrates an outline of processing in a case where the densities DE11 to DE13 illustrated in FIG. 4 are expressed with sound. The densities DE11 to DE13 illustrated in FIG. 4 correspond to the tempos TE11 to TE13, respectively. Here, the density of the density DE is lower as the number of candidate locations included in the density DE is smaller, and the density of the density DE is higher as the number of candidate locations included in the density DE is larger. Therefore, among the densities DE11 to DE13, since the density of the density DE11 is the lowest, the tempo TE11 corresponding to the density DE11 is the slowest. In addition, among the densities DE11 to DE13, since the density of the density DE13 is the highest, the tempo TE13 corresponding to the density DE13 is the fastest. In a case where there is a sound being output before the user U11 directs his/her line of sight in a specific direction, the information processing system 1 changes the tempo of the sound being output to a tempo based on the density of candidate locations included in the specific direction. Furthermore, in a case where there is no sound being output before the user U11 directs his/her line of sight in a specific direction, the information processing system 1 changes, for example, a tempo prescribed in advance by an app or the like installed in the terminal device 30 to a tempo based on the density of candidate locations included in the specific direction.

2.2. Outline of Function: Expressing Sense of Distance and Sense of Orientation with Sound FIGS. 6A and 6B are diagrams illustrating an outline of a function for expressing a sense of distance of a candidate location with sound. The information processing system 1 performs processing for expressing the sense of distance by adjusting the ratio of the sound volume of each sound source using a plurality of sound sources. FIG. 6A illustrates a ratio of each sound volume of the first sound source and the second sound source in a case where the sense of distance is large. The information processing system 1 adjusts the ratio of each sound volume of the first sound source and the second sound source such that the sound volume of the first sound source becomes smaller and the sound volume of the second sound source becomes larger as the sense of distance becomes larger. FIG. 6B illustrates a ratio of each sound volume of the first sound source and the second sound source in a case where the sense of distance is small. The information processing system 1 adjusts the ratio of each sound volume of the first sound source and the second sound source such that the sound volume of the first sound source becomes larger and the sound volume of the second sound source becomes smaller as the sense of distance becomes smaller.

FIGS. 7A and 7B are diagrams illustrating an outline of a function for expressing a sense of orientation of a candidate location with sound. The information processing system 1 performs processing for expressing the sense of orientation by adjusting the sound volume of each of the left and right based on the orientation difference. FIG. 7A illustrates the ratio of each sound volume of the left and right when the orientation difference is large. The information processing system 1 adjusts the sound volume such that the larger the orientation difference, the larger the sound volume on the side where the candidate location is located is than the sound volume on the side where the candidate location is not located. FIG. 7B illustrates the ratio of each sound volume of the left and right when the orientation difference is small. As the orientation difference is smaller, the information processing system 1 adjusts the sound volume such that the side where the candidate location is located is equivalent to the side where the candidate location is not located. Note that the information processing system 1 adjust the ratio of each sound volume of the first sound source and the second sound source included in each of the left and right such that the ratios of the sound volumes of the first sound source and the second sound source included in the left and right become equivalent in the left and right. For example, the information processing system 1 adjusts the ratio of the sound volume of the first sound source to the entire sound sources on the left side to be equivalent to the ratio of the sound volume of the first sound source to the entire sound sources on the right side. Furthermore, for example, the information processing system 1 adjusts the ratio of the sound volume of the second sound source to the entire sound sources on the left side to be equivalent to the ratio of the sound volume of the second sound source to the entire sound sources on the right side.

2.3. Use Case

Hereinafter, the outline of the functions of the information processing system 1 according to the embodiment will be described using individual use cases as examples.

Use Case 1: Restaurant

FIG. 8 illustrates an outline of processing in a case where a recommended restaurant near the user is searched for a meal such as lunch. First, the user searches for a recommended restaurant nearby via the terminal device 30 (S21). When information regarding the search result is acquired, the information processing system 1 performs processing for expressing the search result with sound. Next, the user tries to go to a place where the user usually does not go (S22). The information processing system 1 detects the action of the user. Next, the user performs a predetermined action in a specific direction (S23). For example, the user starts walking in a specific direction. As another example, the user directs his/her line of sight in a specific direction for a certain period of time or more. In a case where a predetermined action of the user in a specific direction satisfies a predetermined condition, the information processing system 1 performs processing of narrowing down candidate locations. Then, the information processing system 1 provides the user with information regarding the candidate locations after narrowing down. Note that the information processing system 1 may perform processing of enlarging (zooming in) the map information so that details of the candidate locations after narrowing down are displayed. Next, the user selects a candidate location (S24). For example, the user selects a candidate location by using a voice, a gesture, or a line-of-sight direction. The information processing system 1 decides a candidate location based on the user's selection. Specifically, the information processing system 1 decides the selected candidate location as a destination to be guided. Then, the information processing system 1 performs processing for guiding to the decided destination.

Use Case 2: Amusement Park (Theme Park)

Figure 9:
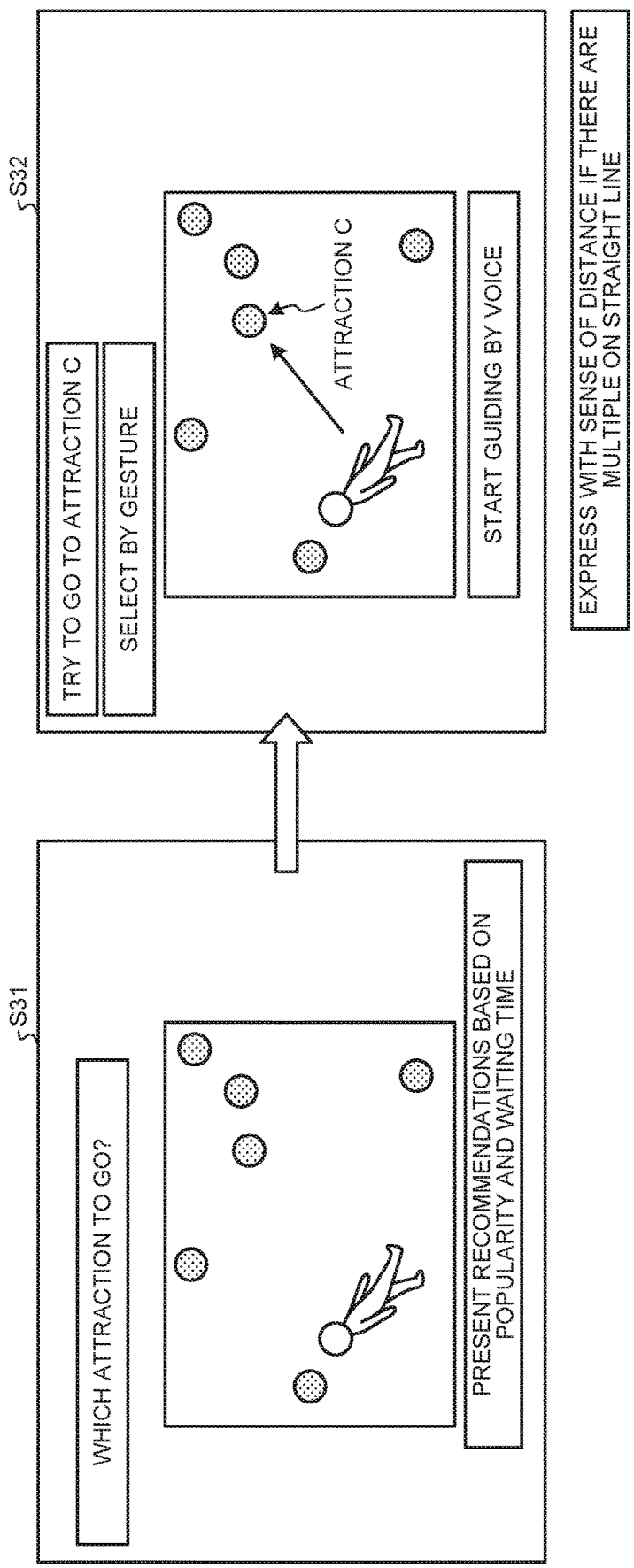
FIG. 9 is a diagram illustrating an example of a use case (amusement park) using the information processing system according to the embodiment.

FIG. 9 illustrates an outline of processing in a case where the user tries to get on an attraction in an amusement park. Note that the same description as in FIG. 8 will be appropriately omitted. In FIG. 9, the density according to the embodiment will be described as popularity, waiting time, and the like of an attraction. The user tries to get on an attraction (S31). The information processing system 1 provides information regarding a recommended attraction based on popularity, waiting time, and the like of the attraction. Next, the user tries to go to attraction C (S32). At this time, the user selects attraction C by gesture, for example. The information processing system 1 performs processing for guiding to the attraction C. Here, in a case where a plurality of candidate locations is included in the specific direction of guidance, the information processing system 1 performs processing for guiding to a specific candidate location by expressing the sense of distance with sound. As a result, the information processing system 1 can appropriately guide the user to a specific candidate location even when a plurality of candidate locations is included on a straight line.

Use Case 3: Amusement Facility (Entertainment)

Figure 10:
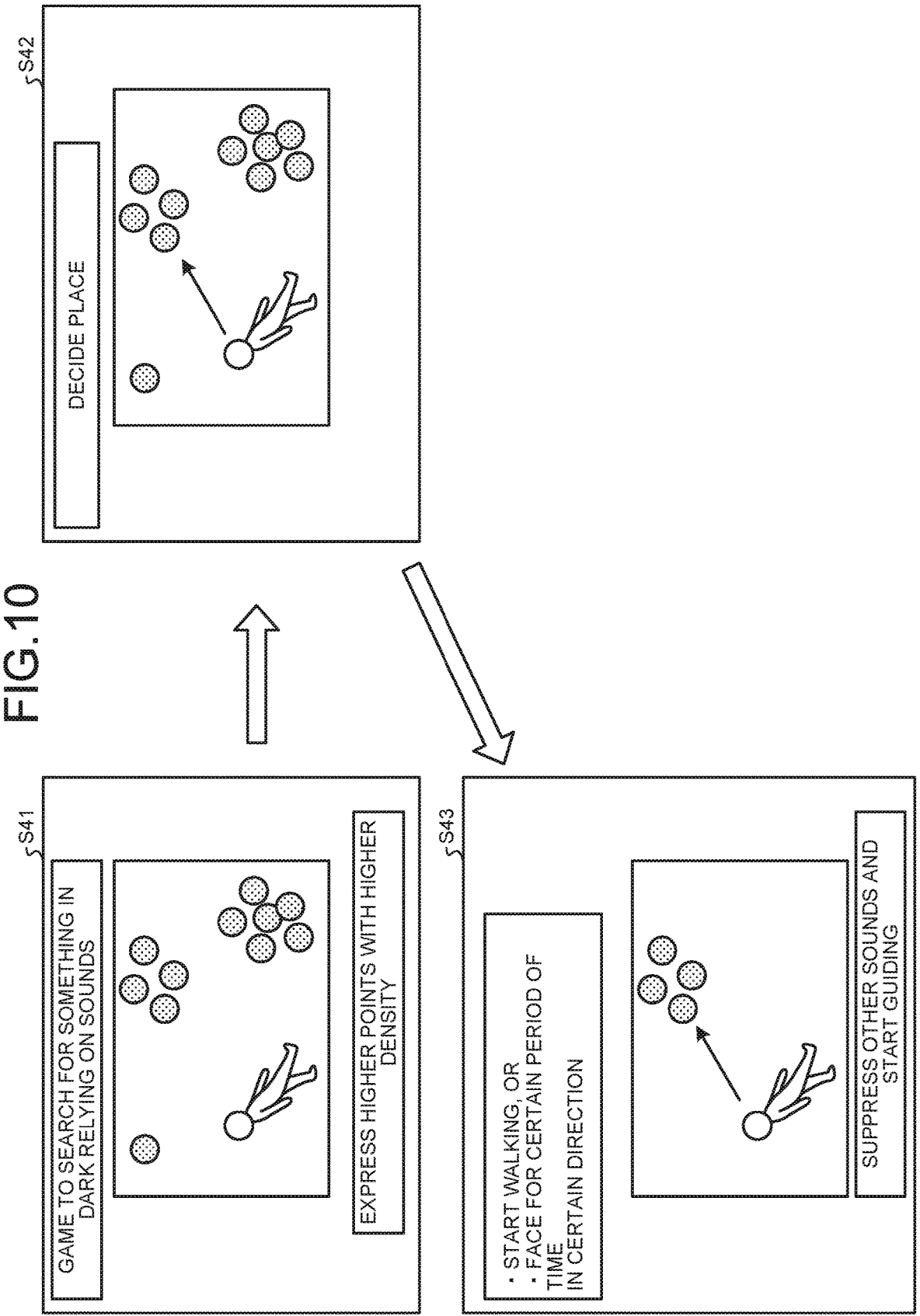
FIG. 10 is a diagram illustrating an example of a use case (amusement facility) using the information processing system according to the embodiment.

FIG. 10 illustrates an outline of processing in a case where the user searches for something relying on sound in the dark in a game (for example, an escape game) such as searching for something in the dark. Note that descriptions similar to those in FIGS. 8 and 9 will be omitted as appropriate. In FIG. 10, the density according to the embodiment will be described as game points. The information processing system 1 performs processing for expressing game points with sound (S41). For example, the information processing system 1 performs processing of making the tempo of sound faster in a direction in which there is a place where higher game points are acquired. The user decides a specific direction in which the user searches based on the tempo of the sound (S42). Next, the user performs a predetermined action in a specific direction (S43). The information processing system 1 performs processing for guiding to a candidate location. Note that the information processing system 1 may perform control so as to suppress the output of other sounds during the guidance to the candidate location. For example, the information processing system 1 may perform control so that the sound of other candidate locations is not output even if the user approaches other candidate locations within a predetermined range during the guidance to the candidate location.

Use Case 4: Art Gallery or Museum

Figure 11:
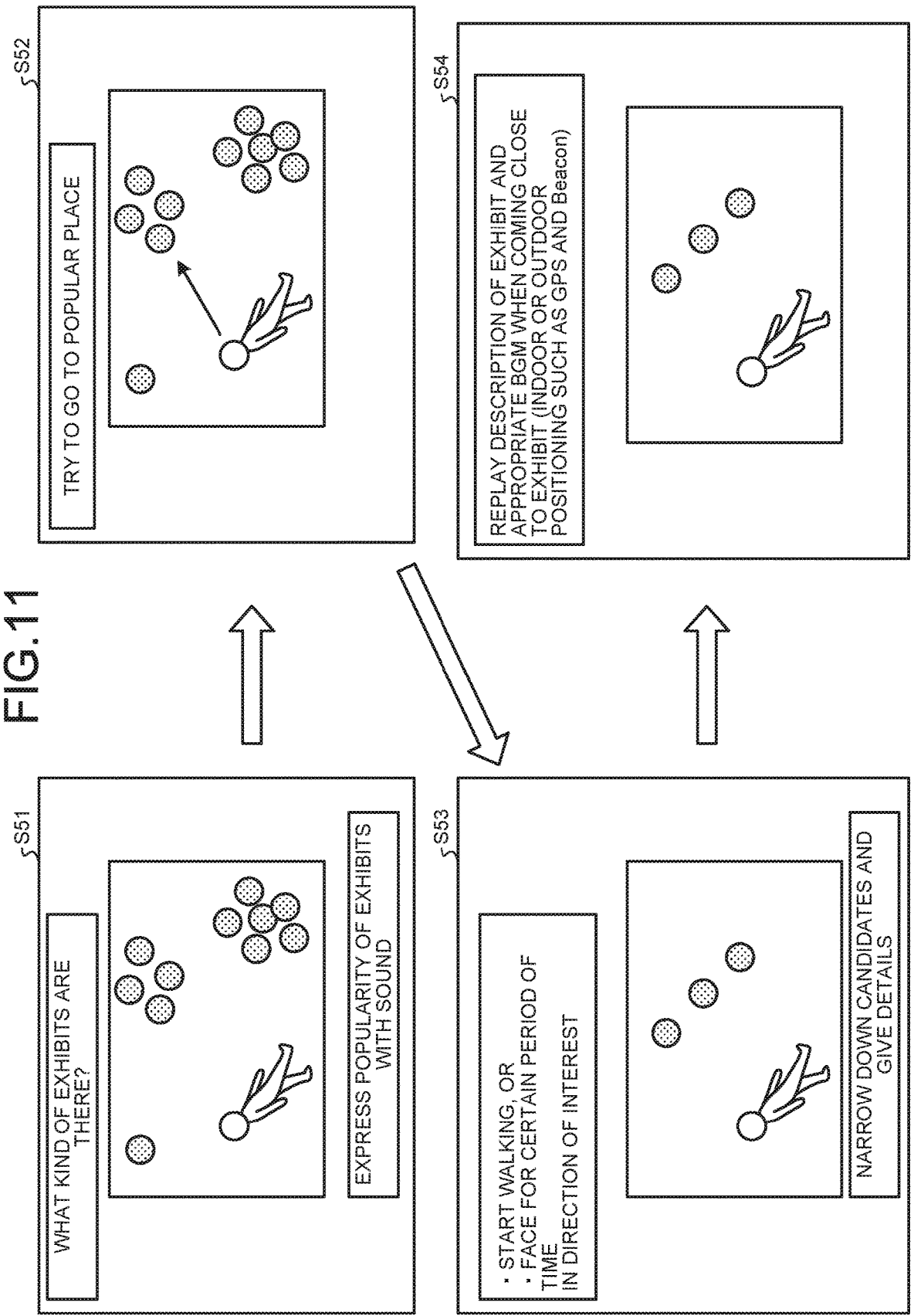
FIG. 11 is a diagram illustrating an example of a use case (art gallery/museum) using the information processing system according to the embodiment.

FIG. 11 illustrates an outline of processing in a case where the user goes around exhibits indoors and outdoors having exhibits such as art galleries and museums. Note that descriptions similar to those in FIGS. 8 to 10 will be omitted as appropriate. In FIG. 11, the density according to the embodiment will be described as popularity of exhibits. The user tries to go around exhibits (S51). The information processing system 1 performs processing for expressing popularity of exhibits with sound. Next, the user tries to go to popular exhibits (S52). The information processing system 1 detects the action of the user. Next, the user performs a predetermined action in a specific direction (S53). In a case where a predetermined action of the user in a specific direction satisfies a predetermined condition, the information processing system 1 performs processing of narrowing down exhibits. Then, the information processing system 1 provides the user with information regarding the exhibits after narrowing down. Then, when the user approaches a predetermined range from an exhibit, the information processing system 1 outputs details (description) of the exhibit or a sound such as a BGM corresponding to the exhibit. Note that the information processing system 1 acquires information regarding the current location of the user via indoor or outdoor positioning such as the global positioning system (GPS) or beacon, for example. For example, in a case where the exhibit is outdoors, the information processing system 1 acquires information regarding the current location of the user based on the GPS. Furthermore, for example, in a case where the exhibit is indoor, the information processing system 1 acquires information regarding the current location of the user based on the beacon.

2.4. Functional Configuration Example

Figure 12:
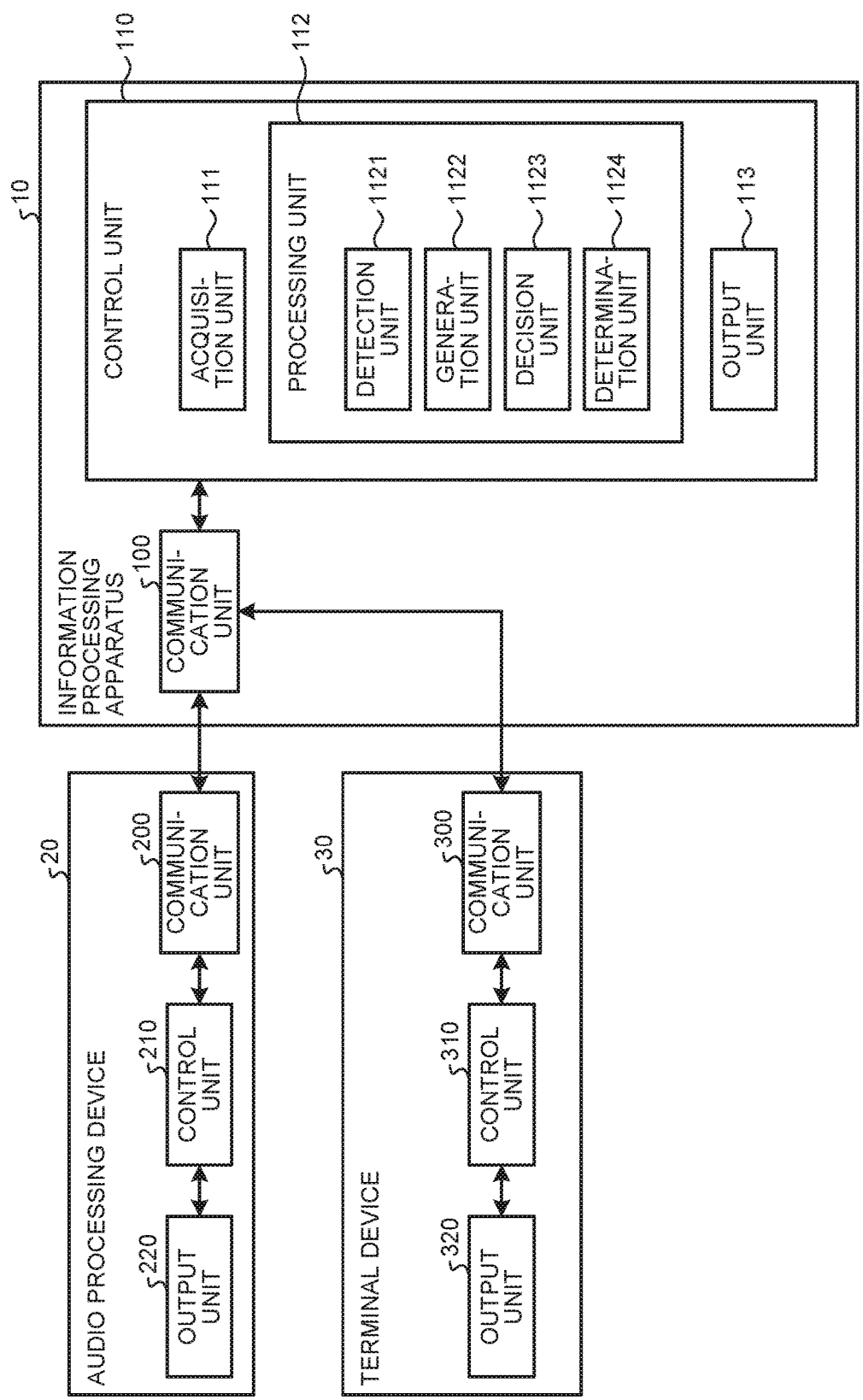
FIG. 12 is a block diagram of the information processing system according to the embodiment.

FIG. 12 is a block diagram illustrating a functional configuration example of the information processing system 1 according to the embodiment.

(1) Information Processing Apparatus 10

As illustrated in FIG. 12, the information processing apparatus 10 includes a communication unit 100 and a control unit 110. Note that the information processing apparatus 10 includes at least the control unit 110.

(1-1) Communication Unit 100

The communication unit 100 has a function of communicating with an external device. For example, in communication with an external device, the communication unit 100 outputs information received from the external device to the control unit 110. Specifically, the communication unit 100 outputs information received from the audio processing device 20 to the control unit 110. For example, the communication unit 100 outputs information regarding the line-of-sight direction of the user detected by the audio processing device 20 to the control unit 110. Furthermore, the communication unit 100 outputs information received from the terminal device 30 to the control unit 110. For example, the communication unit 100 outputs information regarding the search result searched by the terminal device 30 to the control unit 110.

In communication with an external device, the communication unit 100 transmits information input from the control unit 110 to the external device. Specifically, the communication unit 100 transmits information regarding acquisition of the line-of-sight direction of the user input from the control unit 110 to the audio processing device 20. The communication unit 100 may be configured by a hardware circuit (such as a communication processor), and configured to perform processing by a computer program running on the hardware circuit or another processing device (such as a CPU) that controls the hardware circuit.

(1-2) Control Unit 110

The control unit 110 has a function of controlling the operation of the information processing apparatus 10. For example, the control unit 110 performs processing for expressing the sense of distance from the current location of the user to the candidate location using a plurality of sound sources.

In order to implement the above-described functions, the control unit 110 includes an acquisition unit 111, a processing unit 112, and an output unit 113 as illustrated in FIG. 12. The control unit 110 may be constituted by a processor such as a CPU, and may read software (computer program) for implementing each function of the acquisition unit 111, the processing unit 112, and the output unit 113 from a storage unit 120 to perform processing. Furthermore, one or more of the acquisition unit 111, the processing unit 112, and the output unit 113 can be configured by a hardware circuit (processor or the like) different from the control unit 110, and can be configured to be controlled by a computer program operating on another hardware circuit or the control unit 110.

Acquisition Unit 111

The acquisition unit 111 has a function of acquiring information regarding at least one candidate location. The acquisition unit 111 acquires information based on the density of candidate locations. As another example, the acquisition unit 111 may acquire information based on a degree of recommendation, a price, a waiting time, popularity, or the like of a candidate location. Note that the acquisition unit 111 is not limited to these examples, and may acquire any information as long as the information is based on an index of the candidate location. In a case where information based on an index of a candidate location other than the density of candidate locations is acquired, the information processing apparatus 10 may perform processing similar to that in a case where the information based on the density of candidate locations is acquired.

The acquisition unit 111 acquires information regarding the current location of the user. Then, the acquisition unit 111 acquires information regarding the distance and orientation from the current location of the user to each candidate location.

The acquisition unit 111 acquires information regarding the line-of-sight direction of the user. For example, the acquisition unit 111 acquires information regarding the line-of-sight direction detected by the audio processing device 20.

The acquisition unit 111 acquires information regarding each of the first sound source and the second sound source. Note that the acquisition unit 111 may acquire information regarding each of the first sound source and the second sound source decided in any way. For example, the acquisition unit 111 may acquire information regarding each of the first sound source and the second sound source prescribed in advance for each candidate location. As another example, the acquisition unit 111 may acquire information regarding each of the first sound source and the second sound source selected based on the attribute of the candidate location. As another example, the acquisition unit 111 may acquire information regarding the second sound source selected based on the first sound source.

Processing Unit 112

The processing unit 112 has a function of controlling processing of the information processing apparatus 10. As illustrated in FIG. 12, the processing unit 112 includes a detection unit 1121, a generation unit 1122, a decision unit 1123, and a determination unit 1124. Each of the detection unit 1121, the generation unit 1122, the decision unit 1123, and the determination unit 1124 included in the processing unit 112 may be configured as an independent computer program module, or a plurality of functions may be configured as one integrated computer program module.

Detection Unit 1121

The detection unit 1121 has a function of detecting a moving situation (for example, indoor, outdoor) and a moving means (for example, walking, a car, or a train) of the user. Here, the administrator of the content provided at the time of guiding to the destination is hereinafter appropriately referred to as "creator". The creator registers, for example, the content in which the output sound and the map information are associated with each other in a database (hereinafter, "referred to as a sound database" as appropriate) that stores the content. The sound database is implemented by, for example, the storage unit 120 described later.

The detection unit 1121 detects the moving situation and the moving means of the user based on the content registered in advance in the sound database. For example, the detection unit 1121 detects the moving situation and the moving means of the user based on the content in which the moving situation and the moving means of the user and the output sound are registered with respect to the map information. Furthermore, for example, the detection unit 1121 detects the moving situation and the moving means of the user based on content registered for indoor walking, outdoor walking, and for cars and trains.

The detection unit 1121 detects the moving situation and the moving means of the user based on the moving situation and the user's setting for the moving means. For example, in a case where the user sets the moving means to the train, the detection unit 1121 detects the train as the moving means of the user.

The detection unit 1121 detects the moving situation and the moving means of the user using a detector (for example, an active engine). For example, the detection unit 1121 detects a place where the GPS cannot be received or a place that can be determined to be indoor from the current value and the map information as indoor. Furthermore, for example, the detection unit 1121 detects a place where the GPS can be received or a place that can be determined to be outdoors from the current value and the map information as outdoors. Furthermore, for example, the detection unit 1121 detects the moving situation and the moving means of the user using a vehicle detector for detecting a vehicle. For example, the detection unit 1121 detects the moving situation and the moving means of the user based on the moving speed of the user. Specifically, in a case where the moving speed of the user is equal to or more than a predetermined threshold, the detection unit 1121 determines that the user is in a moving body such as a vehicle, and detects the moving situation and the moving means of the user. As another example, the detection unit 1121 detects the moving situation and the moving means of the user based on comparison between the coordinate information in which the user is moving and the coordinate information of a station, a railroad, or the like.

Generation Unit 1122

The generation unit 1122 has a function of generating sound data for expressing the sense of distance from the current location of the user to the candidate location using a plurality of sound sources. For example, the generation unit 1122 generates sound data for expressing the sense of distance to the candidate location by adjusting the ratio of each sound volume of the plurality of sound sources.

Generation of Sound Data Based on Moving Situation, Moving Means, and Distance to Candidate Location The generation unit 1122 adjusts the ratio of each sound volume of the first sound source and the second sound source decided according to at least one of the moving situation of the user, the moving means, and the distance to the candidate location, thereby generating sound data for expressing the sense of distance to the candidate location.

Figure 13:
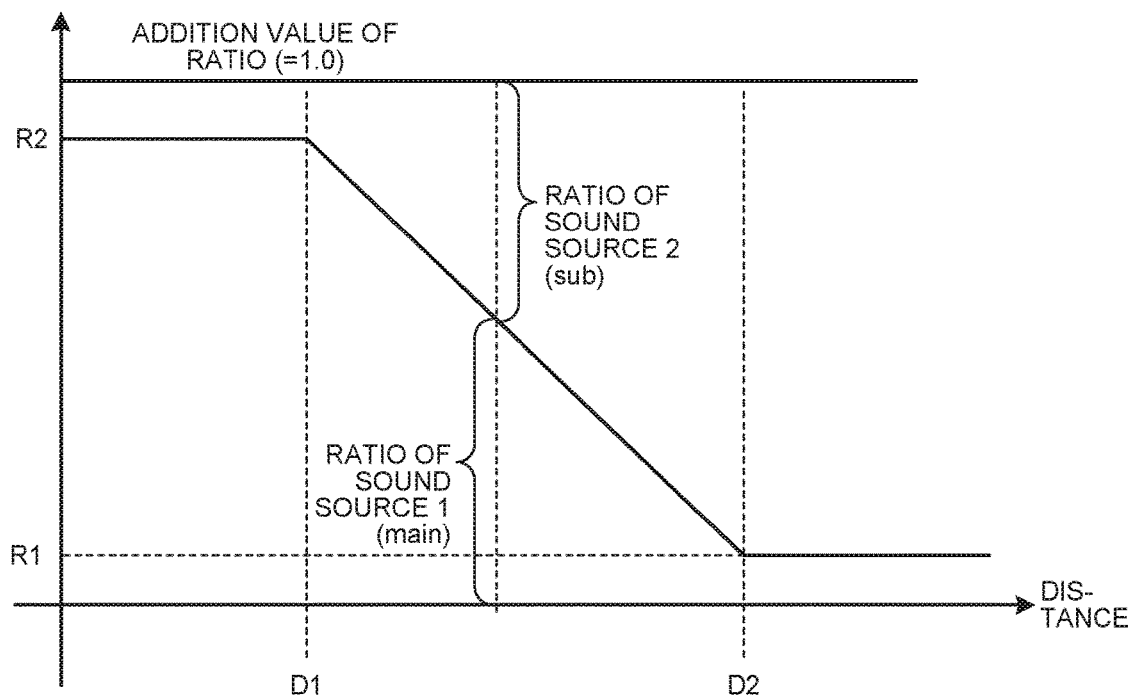
FIG. 13 is a diagram illustrating a method of deciding ratios of sound volumes of sound sources according to the embodiment.

FIG. 13 illustrates an example of a method of deciding the ratio of each sound volume of the first sound source and the second sound source. The distance D is a distance from an initial position (initial location) of the user before departure to the destination. The distance D1 is a first threshold distance at which the distance from the initial location to the destination starts to become equal to or less than a predetermined threshold (first threshold). The distance D2 is a second threshold distance at which the distance from the initial location to the destination starts to become equal to or more than a predetermined threshold (second threshold). The ratio R is a ratio of the sound source corresponding to the distance D. The ratio R1 is a ratio of the first sound source in a case where the distance from the initial location to the destination is the distance D2. The ratio R2 is a ratio of the second sound source in a case where the distance from the initial location to the destination is the distance D1. Note that the ratio of the second sound source is decided based on the ratio of the first sound source and the total value (addition value) of the ratios of the first sound source and the second sound source. In FIG. 13, the distance D and the ratio R are decided according to the distance from the initial location to the destination. The generation unit 1122 generates sound data for expressing the sense of distance to the candidate location with a ratio of each sound volume of the first sound source and the second sound source decided according to the distance from the initial location to the destination. Specifically, as illustrated in FIG. 13, the generation unit 1122 generates sound data for expressing the sense of distance to the candidate location with the ratio of each sound volume of the first sound source and the second sound source decided based on the relationship between the distance D and the ratio R.

The distance D and the ratio R are decided according to the moving situation and the moving means of the user. The generation unit 1122 generates sound data for expressing the sense of distance to the candidate location with a ratio of each sound volume of the first sound source and the second sound source decided according to the moving situation and the moving means of the user. Hereinafter, processing in a case where the ratio of each sound volume of the first sound source and the second sound source is decided according to the moving situation of the user and the moving means will be described.

Figure 14:
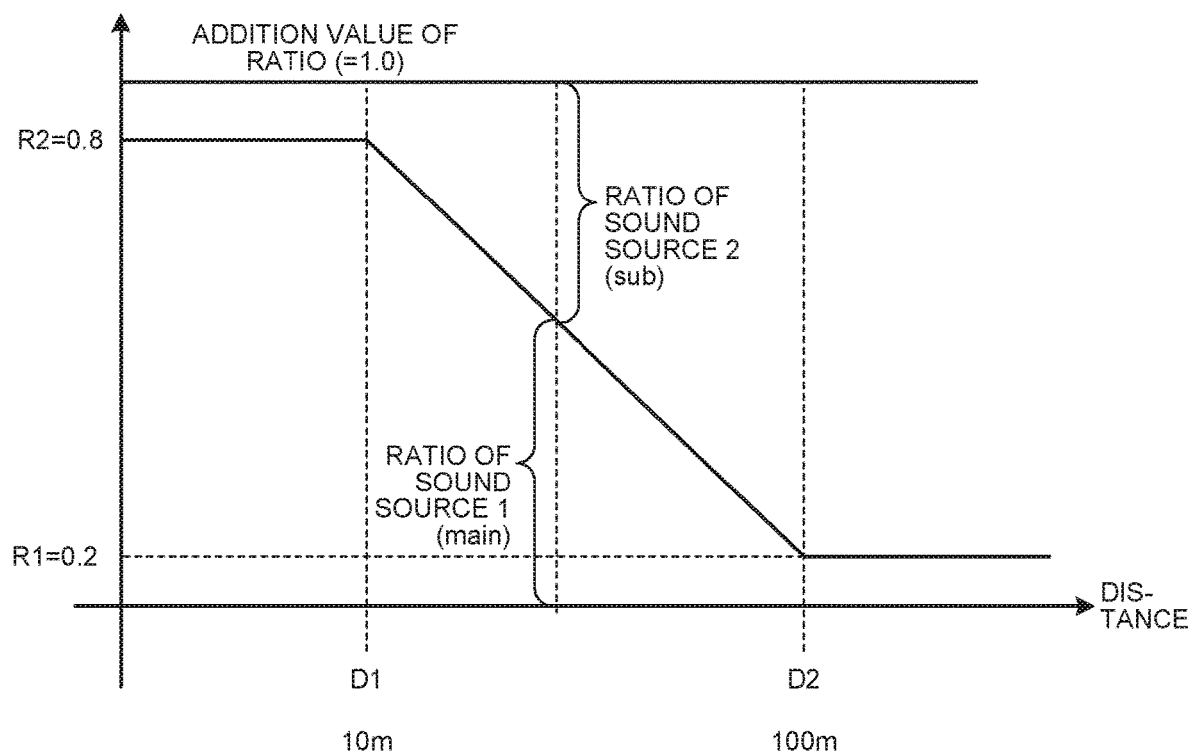
FIG. 14 is a diagram illustrating an example of a method of deciding ratios of sound volumes of sound sources according to the embodiment (in a case of walking indoors).

FIG. 14 illustrates an example of a method of deciding a ratio of each sound volume of the first sound source and the second sound source in a case where the user walks indoors. Note that the same description as in FIG. 13 will be appropriately omitted. In FIG. 14, the ratio R1 is 0.2, and the ratio R2 is 0.8. Here, when the distance from the initial location to the destination exceeds the second threshold, it is assumed that the distance from the initial location to the destination is very long. In this case, the ratio R corresponding to the distance exceeding the second threshold is made uniform. In addition, when the distance from the initial location to the destination is below the first threshold, it is assumed that the distance from the initial location to the destination is very close. In this case, the ratio R corresponding to the distance below the first threshold is made uniform. In FIG. 14, the first threshold and the second threshold are 10 meters and 100 meters, respectively. Here, when the distance from the initial location to the destination exceeds the second threshold, the distance D1 is 10 meters, which is the first threshold, and the distance D2 is 100 meters, which is the second threshold. When the distance from the initial location to the destination is below the first threshold, the distance D1 is half the distance from the initial location to the destination, and the distance D2 is the distance from the initial location to the destination. When the distance from the initial location to the destination is equal to or more than the first threshold and equal to or less than the second threshold, the distance D1 is 10 meters which is the first threshold, and the distance D2 is the distance from the initial value to the destination. As illustrated in FIG. 14, the generation unit 1122 generates sound data for expressing the sense of distance to the candidate location with the ratio of each sound volume of the first sound source and the second sound source decided based on the relationship between the distance D and the ratio R.

Figure 15:
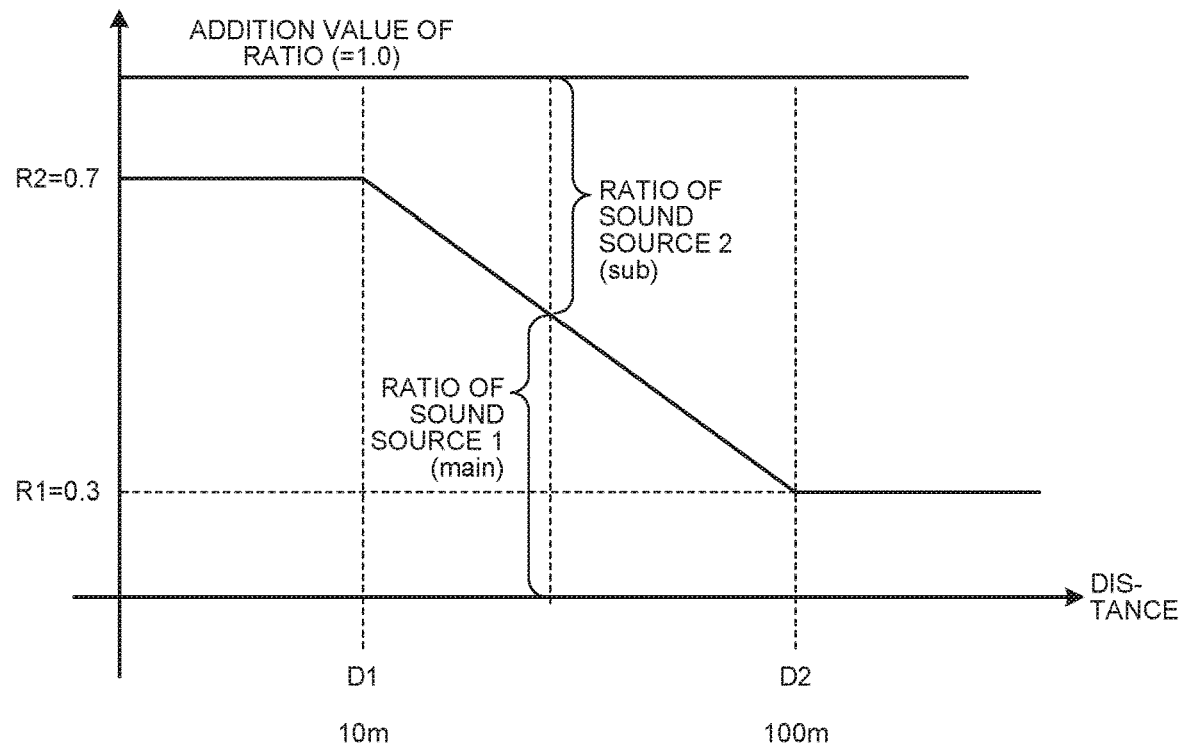
FIG. 15 is a diagram illustrating an example of a method of deciding ratios of sound volumes of sound sources according to the embodiment (in a case of walking outdoors).

FIG. 15 illustrates an example of a method of deciding a ratio of each sound volume of the first sound source and the second sound source in a case where the user walks outdoors. Note that descriptions similar to those in FIGS. 13 and 14 will be omitted as appropriate. Since the surrounding noise level is high outdoors, the first sound source may be less audible than indoors. Therefore, in FIG. 15, the ratio R1 is set to 0.3, and the ratio R2 is set to 0.7. Note that the method of deciding the distance D1 and the distance D2 based on the distance from the initial location to the destination is similar to the case of FIG. 14. As illustrated in FIG. 15, the generation unit 1122 generates sound data for expressing the sense of distance to the candidate location with the ratio of each sound volume of the first sound source and the second sound source decided based on the relationship between the distance D and the ratio R. In the above example, the ratio R1 is set to 0.3 and the ratio R2 is set to 0.7, but the present invention is not limited thereto, and the values of the ratios R1 and R2 may be appropriately changed according to the surrounding noise level.

Figure 16:
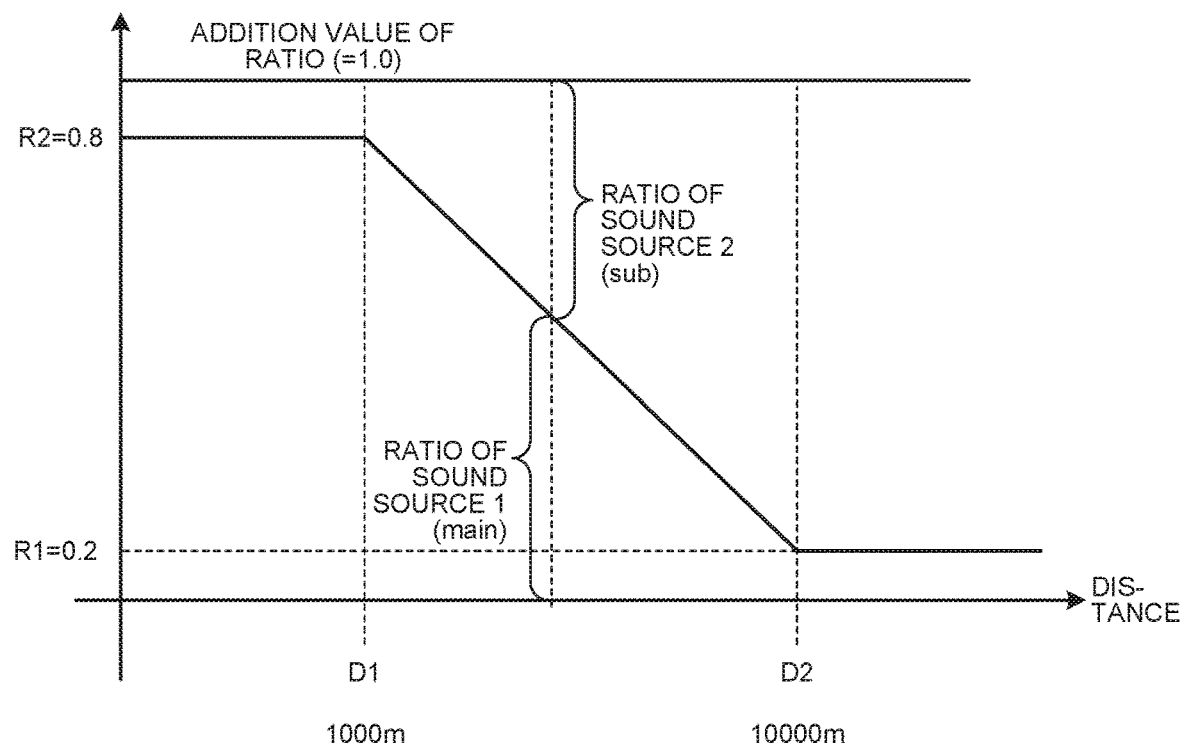
FIG. 16 is a diagram illustrating an example of a method of deciding ratios of sound volumes of sound sources according to the embodiment (in a case of moving with a moving body).

FIG. 16 illustrates an example of a method of deciding a ratio of each sound volume of the first sound source and the second sound source in a case where the user moves by a moving body such as a car or a train. Note that descriptions similar to those in FIGS. 13 to 15 will be omitted as appropriate. In FIG. 16, the ratio R1 is 0.2, and the ratio R2 is 0.8. In FIG. 16, since the moving means is a moving body, the distance from the initial location to the destination may be longer than that in the case of walking. Therefore, in FIG. 16, unlike the cases of FIGS. 14 and 15, the distance D1 is 1 km, and the distance D2 is 10 km. Note that the method of deciding the distance D1 and the distance D2 based on the distance from the initial location to the destination is similar to the case of FIG. 14. As illustrated in FIG. 16, the generation unit 1122 generates sound data for expressing the sense of distance to the candidate location with the ratio of each sound volume of the first sound source and the second sound source decided based on the relationship between the distance D and the ratio R.

Generation of Sound Data Based on Density

The generation unit 1122 generates sound data for expressing the density of candidate locations. For example, the generation unit 1122 generates sound data for expressing the density of candidate locations by adjusting the tempo of the sound output by the output unit 113 to be described later. Specifically, the generation unit 1122 generates sound data in which sound is output at a tempo corresponding to the density of candidate locations in the line-of-sight direction of the user.

The generation unit 1122 generates sound data such that sound is output at a tempo decided based on the relationship between the density of candidate locations and the tempo of the output sound. In addition, when sound is being output, the generation unit 1122 generates sound data in which sound is output at a tempo changed according to the density of candidate locations from the tempo of the sound being output. As another example, in a case where sound is not being output, the generation unit 1122 generates sound data in which sound is output at a tempo changed according to the density from a tempo prescribed in advance.

Figure 17:
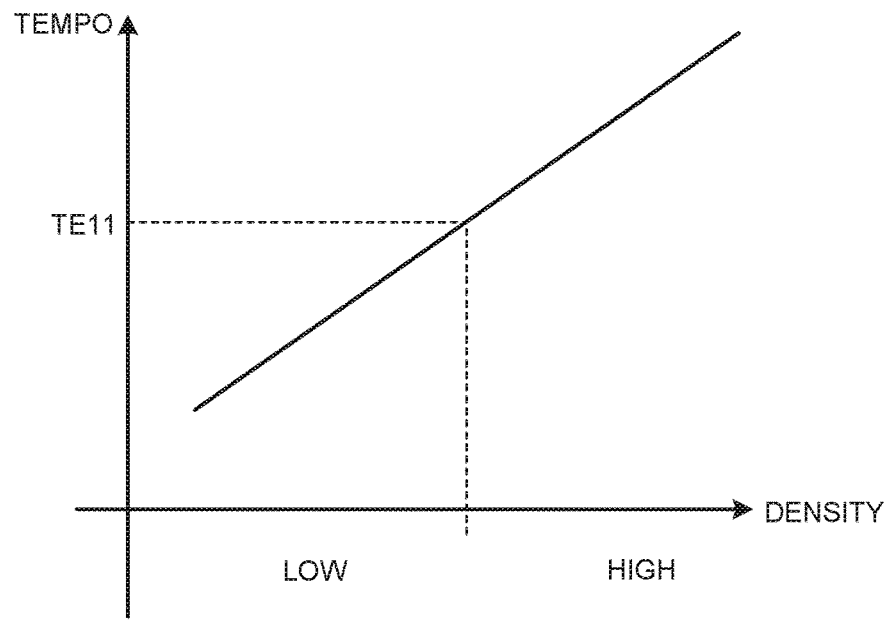
FIG. 17 is a diagram illustrating a relationship between a tempo of output sound and a density according to the embodiment.

FIG. 17 illustrates a relationship between the density of candidate locations in the line-of-sight direction of the user and the tempo of the output sound. The generation unit 1122 generates sound data for outputting sound at a tempo proportional to the density of candidate locations. The generation unit 1122 generates sound data based on, for example, the tempo TE11 at which the density of candidate locations is average. In addition, the generation unit 1122 generates sound data for expressing high density at a tempo higher than the tempo TE11. In addition, the generation unit 1122 generates sound data for expressing low density at a tempo lower than the tempo TE11.

The generation unit 1122 may generate sound data by adjusting the pitch instead of the tempo described above. Furthermore, the generation unit 1122 may generate sound data by adjusting acoustic characteristics other than the tempo and the pitch.

Generation of Sound Data Based on Set Value of User

Figure 18:
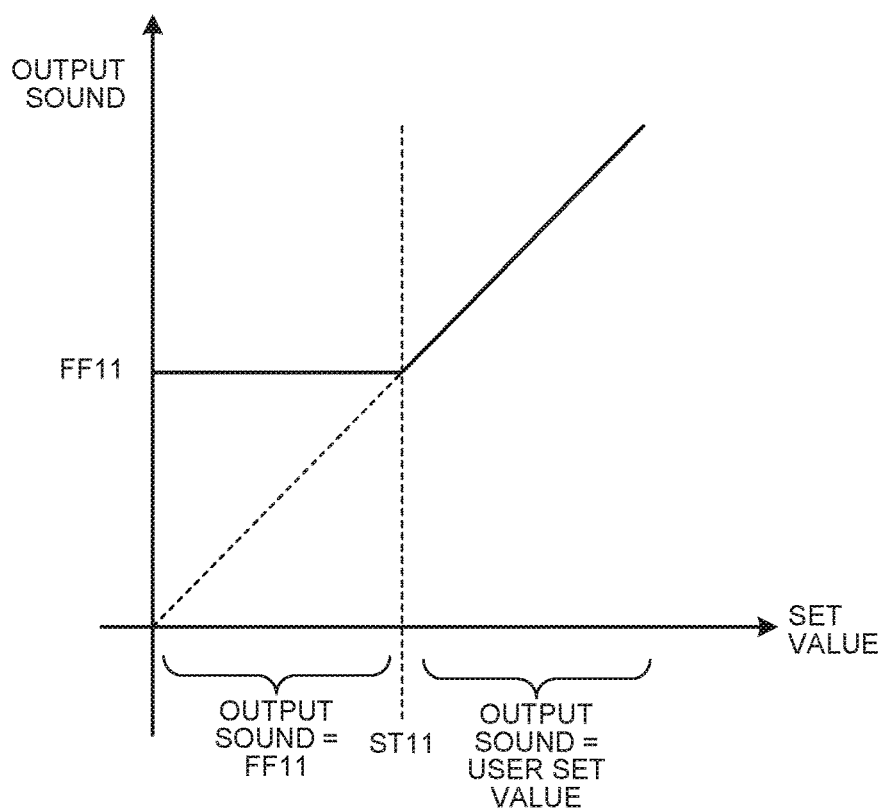
FIG. 18 is a diagram illustrating a relationship between a sound volume of output sound and a user set value according to the embodiment.

The generation unit 1122 generates sound data so that the sound volume of the output sound becomes a sound volume according to the set value of the user. Here, in a case where the set value of the user is too small, it may be difficult to hear the output sound. Therefore, the generation unit 1122 generates sound data in which the sound volume of the output sound does not become equal to or less than a predetermined threshold prescribed in advance. For example, based on a predetermined threshold decided according to the surrounding noise level, the generation unit 1122 may generate sound data in which the sound volume of the output sound is not less than or equal to the predetermined threshold. FIG. 18 illustrates a relationship between the set value of the user and the sound volume of the output sound. Note that the sound volume of the output sound may be a sound volume prescribed for the application as the output sound at the time of application activation. In FIG. 18, the generation unit 1122 generates sound data that does not fall below the threshold FF11. In addition, in a case where the sound volume exceeds the set value ST11, the generation unit 1122 generates sound data for outputting sound with a sound volume proportional to the set value. Then, in a case where the sound volume does not exceed the set value ST11, the generation unit 1122 generates sound data for outputting sound with a sound volume of the threshold FF11.

Generation of Sound Data Based on Attribute of Candidate Location

The generation unit 1122 generates sound data using a plurality of sound sources according to the attribute of the candidate location. As a specific example, in a case where the attribute of the candidate location is a restaurant, an amusement park, an amusement facility, an art gallery, or a museum, the generation unit 1122 generates sound data using a plurality of sound sources corresponding to each attribute.

Generation of Sound Data Based on Attribute of Candidate Location

The generation unit 1122 generates sound data for expressing the sense of orientation to the candidate location instead of the sense of distance described above. For example, the generation unit 1122 generates sound data for expressing the sense of orientation to the candidate location by adjusting the sound volume of each of the left and right output sounds. Specifically, in a case where the orientation difference between the left and right is large, the generation unit 1122 generates sound data adjusted so that the sound volume on the side where the candidate location is located is larger. In addition, for example, in a case where the orientation difference between the left and right is small, the generation unit 1122 generates sound data adjusted so that the sound volume on the side where the candidate location is located is equivalent to the sound volume on the side where the candidate location is not located.

Decision Unit 1123

The decision unit 1123 has a function of deciding a candidate location. The decision unit 1123 decides one or more candidate locations to be targeted from among the plurality of candidate locations. For example, the decision unit 1123 decides a destination. Furthermore, the decision unit 1123 decides a candidate location based on the user's selection. For example, the decision unit 1123 decides a candidate location selected based on the user's voice, gesture, or line-of-sight direction. Specifically, the decision unit 1123 decides a candidate location based on an instruction by a user's voice. Furthermore, for example, the decision unit 1123 decides a candidate location based on a gesture of the user such as nodding. Furthermore, for example, the decision unit 1123 decides a candidate location based on the orientation of the line-of-sight direction of the user.

When the number of candidate locations is equal to or greater than a predetermined threshold, the decision unit 1123 repeats the processing by decision unit 1123 until the number of candidate locations falls below the predetermined threshold.

The decision unit 1123 decides the first sound source and the second sound source. For example, the decision unit 1123 decides a sound source for expressing the density of candidate locations with sound. Furthermore, for example, the decision unit 1123 decides a sound source for expressing the sense of distance and the sense of orientation of the candidate location with sound. In addition, the decision unit 1123 makes a decision by calculating a distance and an orientation of each candidate location from the current location of the user based on the position information.

The decision unit 1123 decides a ratio of each sound volume of the first sound source and the second sound source. In this case, the generation unit 1122 generates sound data by adjusting the ratio of each sound volume of the first sound source and the second sound source decided by the decision unit 1123.

Determination Unit 1124

The determination unit 1124 has a function of making a determination regarding a destination. For example, the determination unit 1124 determines whether or not a destination to be guided can be decided from a plurality of candidate locations. Furthermore, for example, the determination unit 1124 determines whether or not the user has arrived at the destination.

Output Unit 113

The output unit 113 has a function of outputting sound data generated by the generation unit 1122. For example, the output unit 113 outputs the sound data to a plurality of sound sources. The output unit 113 provides the sound data to, for example, the audio processing device 20 via the communication unit 100. When the sound data is received, the audio processing device 20 outputs sound based on the sound data. Specifically, the audio processing device 20 outputs sound by performing sound localization processing based on the user's line-of-sight direction and the density of candidate locations.

(1-3) Storage Unit 120

The storage unit 120 is implemented by, for example, a semiconductor memory element such as a random access memory (RAM) or a flash memory, or a storage device such as a hard disk or an optical disk. The storage unit 120 has a function of storing a computer program or data (including a form of program) related to processing in the information processing apparatus 10.

FIG. 19 illustrates an example of the storage unit 120. The storage unit 120 illustrated in FIG. 19 stores information regarding the sound source according to the embodiment. As illustrated in FIG. 19, the storage unit 120 may include items such as "sound source ID", "candidate location attribute", "first sound source", and "second sound source".

"Sound source ID" indicates identification information for identifying a sound source. "Candidate location attribute" indicates an attribute of a candidate location targeted by the sound source identified by the sound source ID. "First sound source" indicates the first sound source. "Second sound source" indicates the second sound source. For example, the attribute of the candidate location targeted by the sound source identified by the MU11 is a restaurant, the first sound source included in the sound source is a navigation sound, and the second sound source included in the sound source is a BGM.

Figure 20:
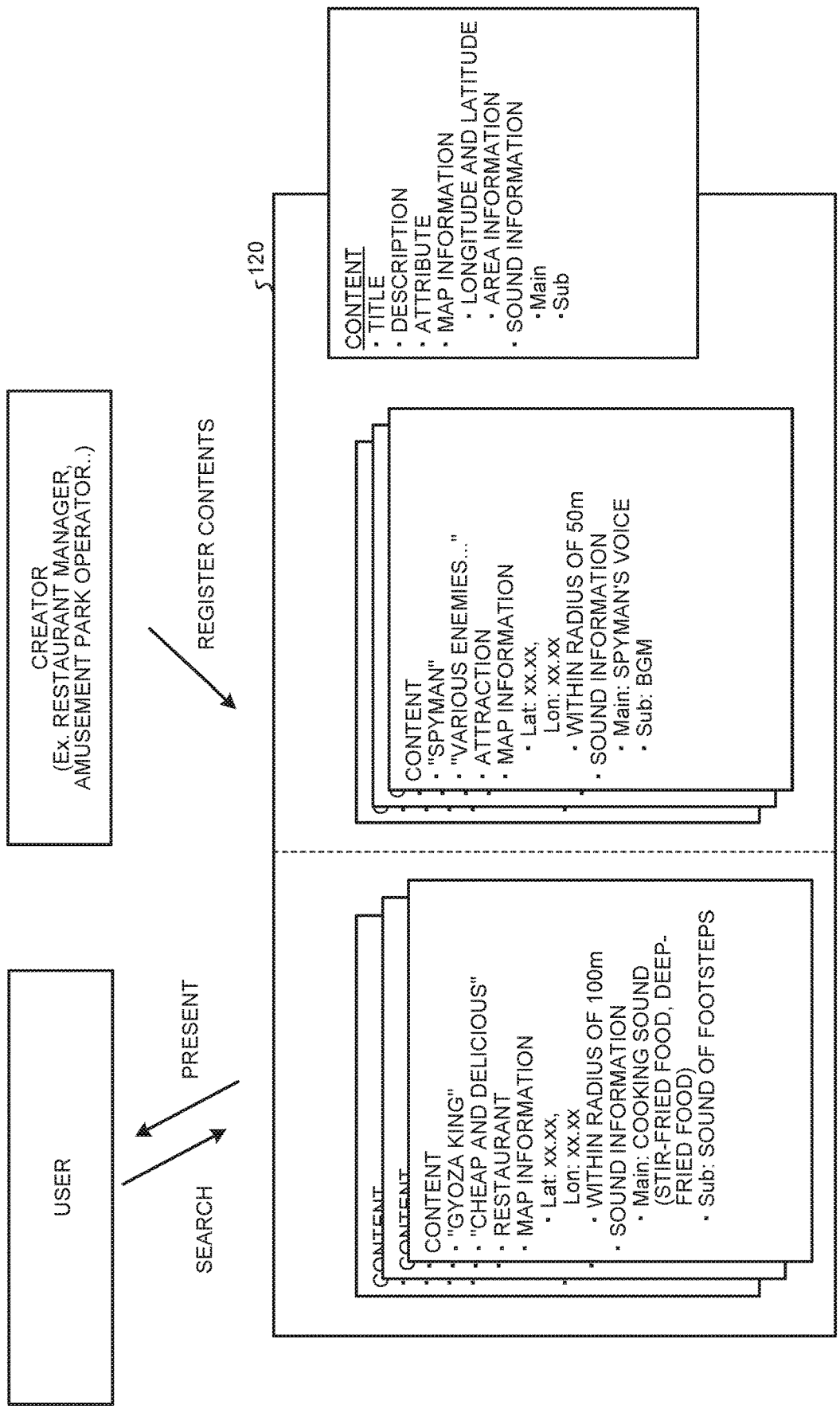
FIG. 20 is a diagram illustrating an example of a sound database according to the embodiment.

FIG. 20 illustrates an example of a sound database. Specifically, FIG. 20 illustrates an example of a sound database storing content registered by creators. The creator registers, for example, a title, a description, an attribute, map information (for example, latitude, longitude, and area information), a sound source (for example, the first sound source and the second sound source), and the like as the content. Note that the sound source registered by the creator may be set by being overwritten on an arbitrary sound source by the user. When search of the user is accepted, the processing unit 112 accesses the sound database and performs processing for providing a service based on the content corresponding to the search.

(2) Audio Processing Device 20

As illustrated in FIG. 12, the audio processing device 20 includes a communication unit 200, a control unit 210, and an output unit 220.

(2-1) Communication Unit 200

The communication unit 200 has a function of communicating with an external device. For example, in communication with an external device, the communication unit 200 outputs information received from the external device to the control unit 210. Specifically, the communication unit 200 outputs information received from the information processing apparatus 10 to the control unit 210. For example, the communication unit 200 outputs information regarding acquisition of sound data to the control unit 210.

(2-2) Control Unit 210

The control unit 210 has a function of controlling the operation of the audio processing device 20. For example, the control unit 210 transmits information regarding the user's voice, gesture, or line-of-sight direction detected by the audio processing device 20 to the information processing apparatus 10 via the communication unit 200.

(2-3) Output Unit 220

The output unit 220 is implemented by a member capable of outputting sound such as a speaker. The output unit 220 outputs sound based on the sound data.

(3) Terminal Device 30

As illustrated in FIG. 12, the terminal device 30 includes a communication unit 300, a control unit 310, and an output unit 320.

(3-1) Communication Unit 300

The communication unit 300 has a function of communicating with an external device. For example, in communication with an external device, the communication unit 300 outputs information received from the external device to the control unit 310.

(3-2) Control Unit 310

The control unit 310 has a function of controlling the overall operation of the terminal device 30. For example, the control unit 310 performs processing of searching for candidate locations based on an input of the user (for example, input by voice or operation).

(3-3) Output Unit 320

The output unit 320 has a function of controlling output of information regarding the search result. For example, the output unit 320 outputs information regarding a search result based on the input of the user. For example, the output unit 320 outputs map information including a candidate location that can be a destination of the user.

2.5. Processing of Information Processing System

The functions of the information processing system 1 according to the embodiment have been described above. Next, processing of the information processing system 1 will be described.

Figure 21:
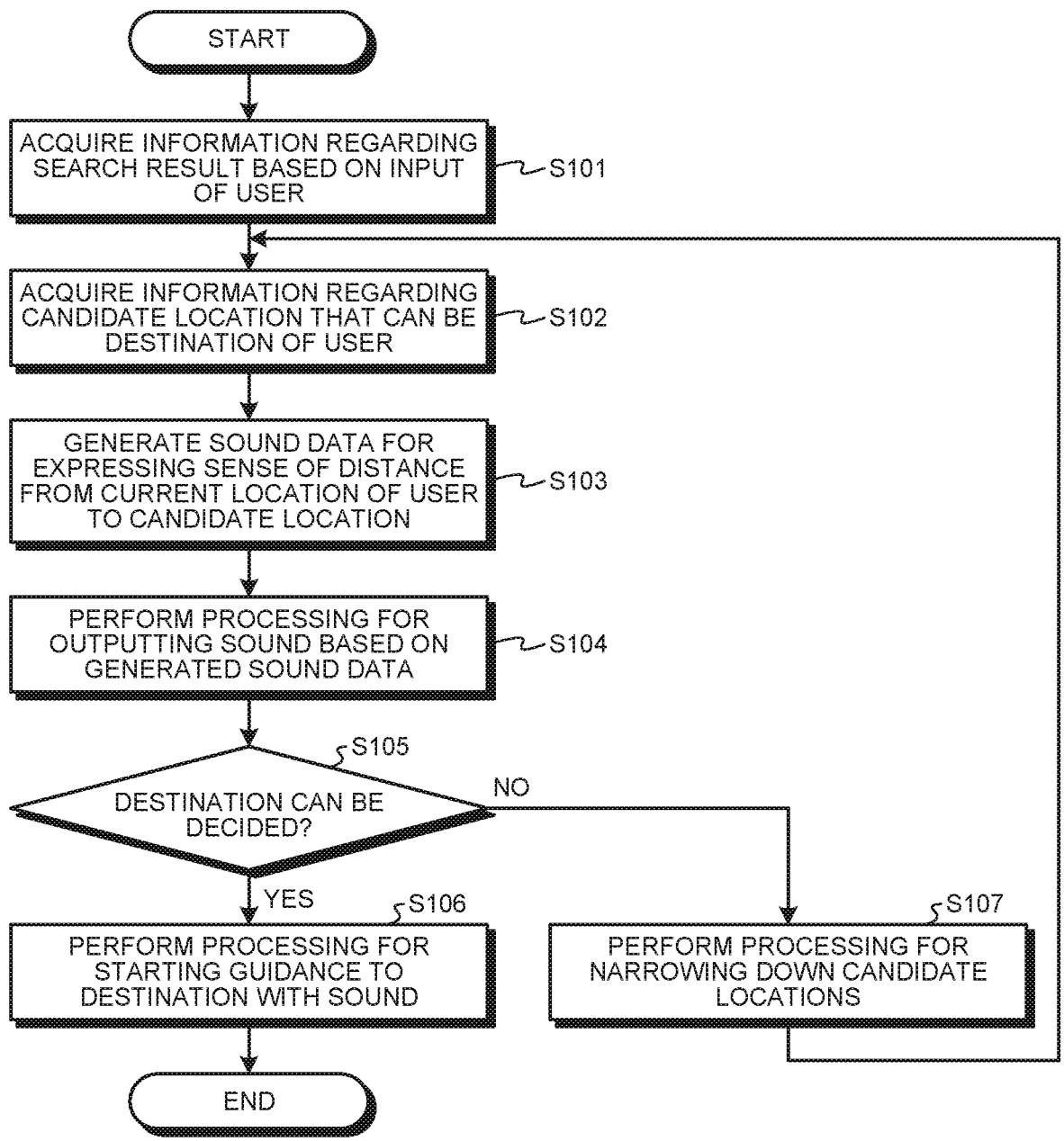
FIG. 21 is a flowchart illustrating a flow of processing in an information processing apparatus according to the embodiment.

(1) Process 1 in Information Processing Apparatus 10: from Search to Guidance FIG. 21 is a flowchart illustrating a flow of processing from search to guidance in the information processing apparatus 10 according to the embodiment. The information processing apparatus 10 acquires information regarding a search result based on an input of the user (S101). Next, the information processing apparatus 10 acquires information regarding a candidate location that can be a destination of the user (S102). Then, the information processing apparatus 10 generates sound data for expressing a sense of distance from the current location of the user to the candidate location (S103). Next, the information processing apparatus 10 performs processing for outputting sound based on the generated sound data (S104). Then, the information processing apparatus 10 determines whether or not a destination can be decided based on the selection by the user (S105). In a case where the information processing apparatus 10 determines that the destination can be decided (S105; YES), a process for starting guidance to the destination with sound is performed (S106). Note that details of the processing in step S106 will be described with reference to FIG. 22. In addition, in a case where the information processing apparatus 10 determines that the destination cannot be decided (S105; NO), a process of narrowing down the candidate locations is performed (S107). Then, the process returns to step S102.

(2) Process 2 in Information Processing Apparatus 10: Guidance

Figure 22:
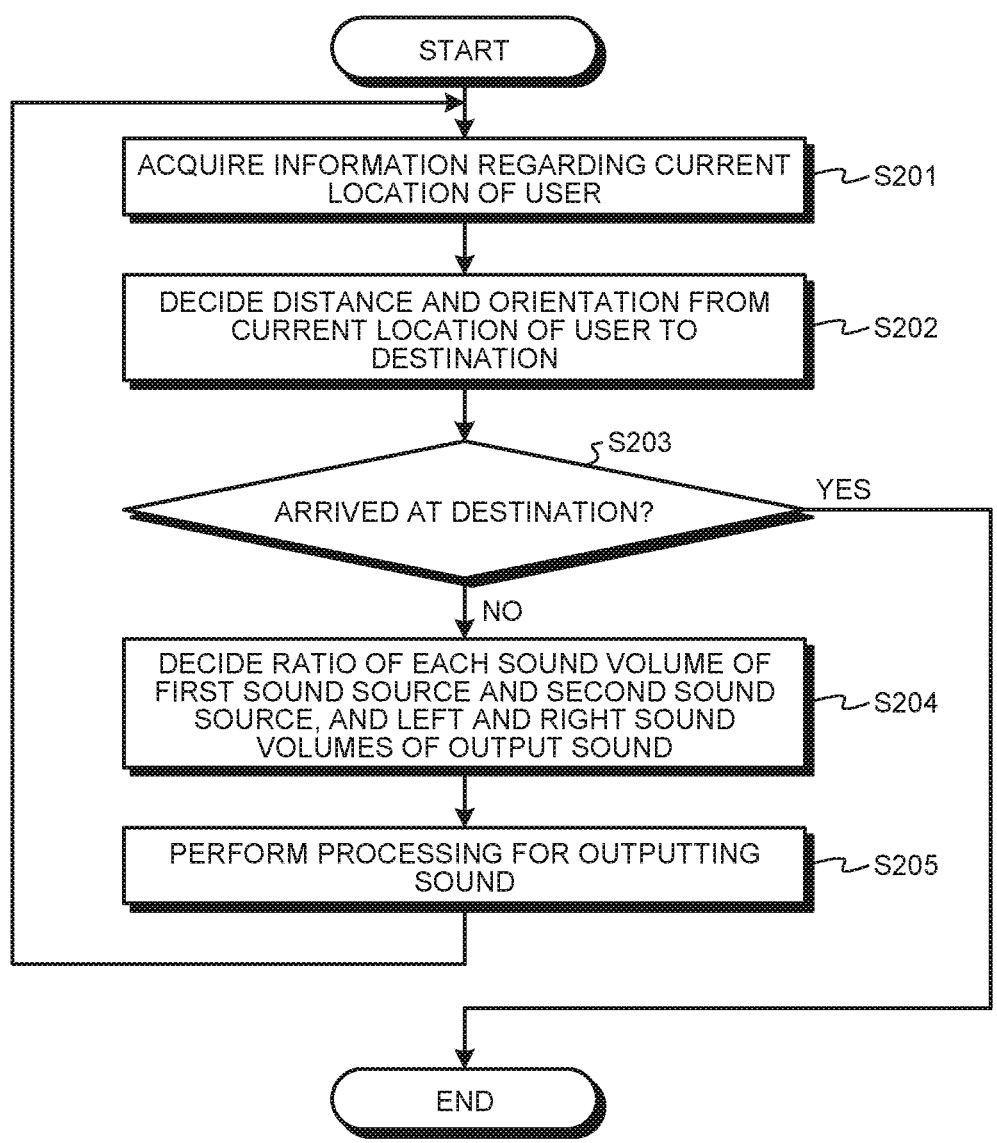
FIG. 22 is a flowchart illustrating a flow of processing in the information processing apparatus according to the embodiment.

FIG. 22 is a flowchart illustrating a flow of processing of guidance in the information processing apparatus 10 according to the embodiment. The information processing apparatus 10 acquires information regarding the current location of the user (for example, position information or orientation information) (S201). Furthermore, the information processing apparatus 10 decides the distance and orientation from the current location of the user to the destination (S202). Next, the information processing apparatus 10 determines whether or not the user has arrived at the destination (S203). In a case where the information processing apparatus 10 determines that the user has arrived at the destination (S203; YES), the information processing is terminated. Furthermore, in a case where the information processing apparatus 10 determines that the user has not arrived at the destination (S203; NO), the ratio of each sound volume of the first sound source and the second sound source, and the left and right sound volumes of the output sound are decided (S204). For example, the information processing apparatus 10 decides the ratio of each sound volume of the first sound source and the second sound source and the left and right sound volumes of the output sound based on the distance and the orientation from the current location of the user to the destination. Then, the information processing apparatus 10 performs processing for outputting sound with the ratio of each sound volume of the first sound source and the second sound source and the left and right sound volumes of the output sound (S205). Then, the information processing apparatus 10 returns to the processing of step 5201.

2.6. Processes of Use Cases

Next, processing of the information processing system 1 corresponding to each use case will be described.

(1) Use Case 1: Restaurant

Figure 23:
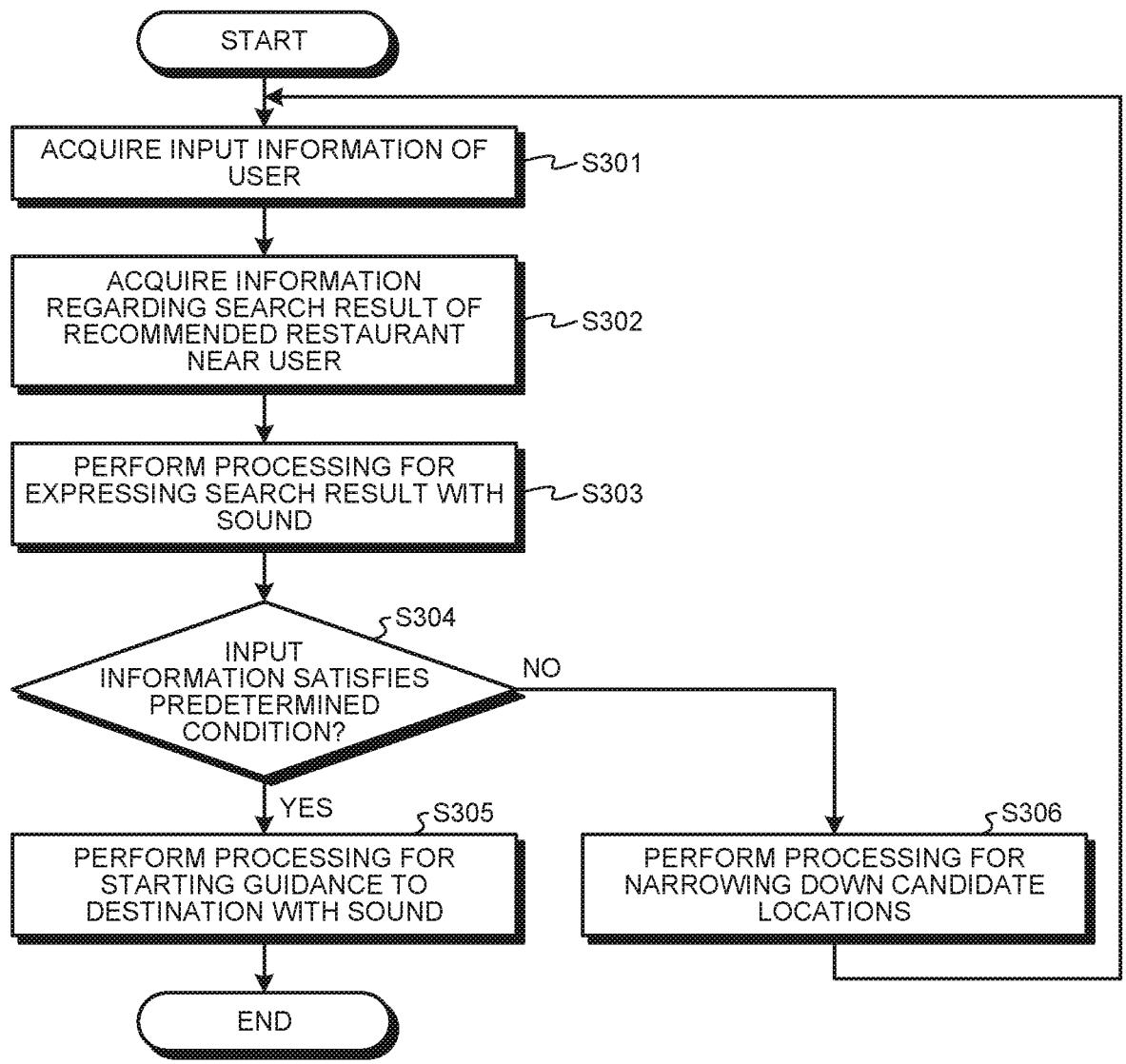
FIG. 23 is a flowchart illustrating a flow of processing of an example of a use case (restaurant) in the information processing apparatus according to the embodiment.

FIG. 23 is a flowchart illustrating a flow of processing of the information processing apparatus 10 according to the embodiment in a case of guiding to a restaurant. The information processing apparatus 10 acquires input information for searching for a recommended restaurant near the user (S301). Next, the information processing apparatus 10 acquires information regarding a search result of a recommended restaurant near the user (S302). For example, the information processing apparatus 10 acquires information regarding a search result of a recommended restaurant near the user based on the GPS and service information provided by a map service such as Google Map (registered trademark), a gourmet service such as Tabelog (registered trademark), or the like. Then, the information processing apparatus 10 performs processing for expressing the search result with sound (S303). Specifically, the information processing apparatus 10 performs processing for expressing the magnitude of the density based on the search result with a tempo of sound. Next, the information processing apparatus 10 determines whether or not the input information based on the action of the user satisfies a predetermined condition (S304). For example, the information processing apparatus 10 determines whether or not the destination can be decided by the user's voice, gesture, or line-of-sight direction. In a case where the information processing apparatus 10 determines that the input information based on the action of the user satisfies the predetermined condition (S304; YES), a process for starting guidance to the destination with sound is performed (S305). Furthermore, in a case where the information processing apparatus 10 determines that the input information based on the action of the user does not satisfy the predetermined condition (S304; NO), a process of narrowing down the candidate locations is performed with a direction in which the user starts walking or a direction in which the user faces for a certain period of time or more as a direction in which the user is interested (S306). Then, the process returns to step S303.

(2) Use Case 2: Amusement Park

Figure 24:
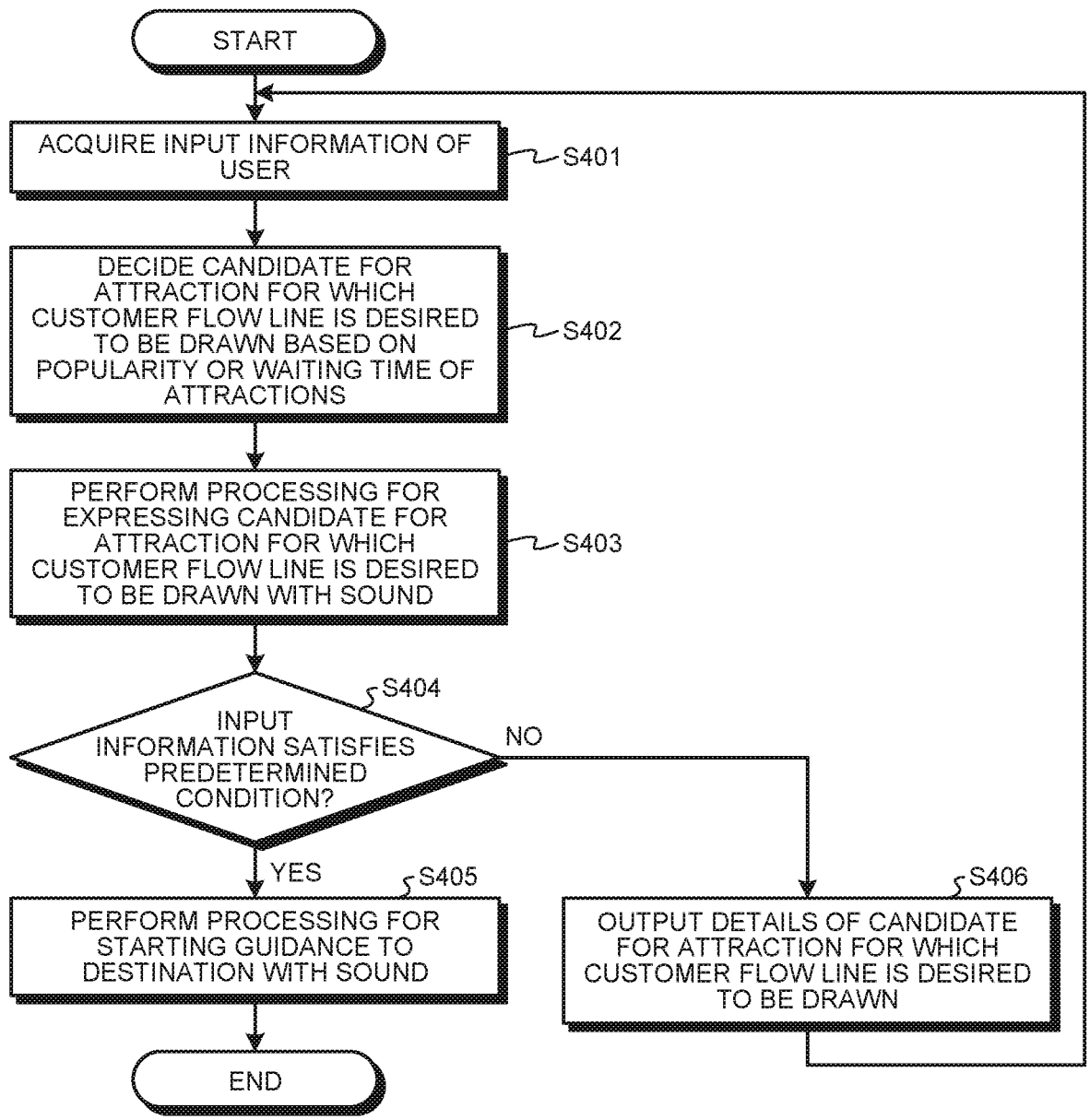
FIG. 24 is a flowchart illustrating a flow of processing of an example of a use case (amusement park) in the information processing apparatus according to the embodiment.

FIG. 24 is a flowchart illustrating a flow of processing of the information processing apparatus 10 according to the embodiment in a case of guiding to an attraction in an amusement park. The information processing apparatus 10 acquires information regarding a predetermined area in an amusement park as input information (S401). For example, the information processing apparatus 10 acquires position information near an entrance of an amusement park as input information. Next, the information processing apparatus 10 decides a candidate for an attraction for which a customer flow line is desired to be drawn, among attractions included in a predetermined area based on the acquired input information, based on popularity, waiting time, and the like of the attractions (S402). For example, the information processing apparatus 10 decides an attraction whose waiting time is equal to or less than a predetermined threshold as a candidate for an attraction for which a customer flow line is desired to be drawn. Then, the information processing apparatus 10 performs processing for expressing a candidate for an attraction for which a customer flow line is desired to be drawn with sound (S403). Specifically, the information processing apparatus 10 performs processing for expressing the magnitude of the density based on a candidate for attraction for which a customer flow line is desired to be drawn with a tempo of sound. Next, the information processing apparatus 10 determines whether or not the input information based on the action of the user satisfies a predetermined condition (S404). For example, the information processing apparatus 10 determines whether or not the user goes to any direction of a candidate for an attraction for which a customer flow line is desired to be drawn. In a case where the information processing apparatus 10 determines that the input information based on the action of the user satisfies the predetermined condition (S404; YES), a process for starting guidance to the destination with sound is performed (S405). Furthermore, in a case where the information processing apparatus 10 determines that the input information based on the action of the user does not satisfy the predetermined condition (S404; NO), a process for outputting details (for example, description of attraction or waiting time) of a candidate for an attraction for which a customer flow line is desired to be drawn is performed (S406). Then, the process returns to step S404.

(3) Use Case 3: Amusement Facility

Figure 25:
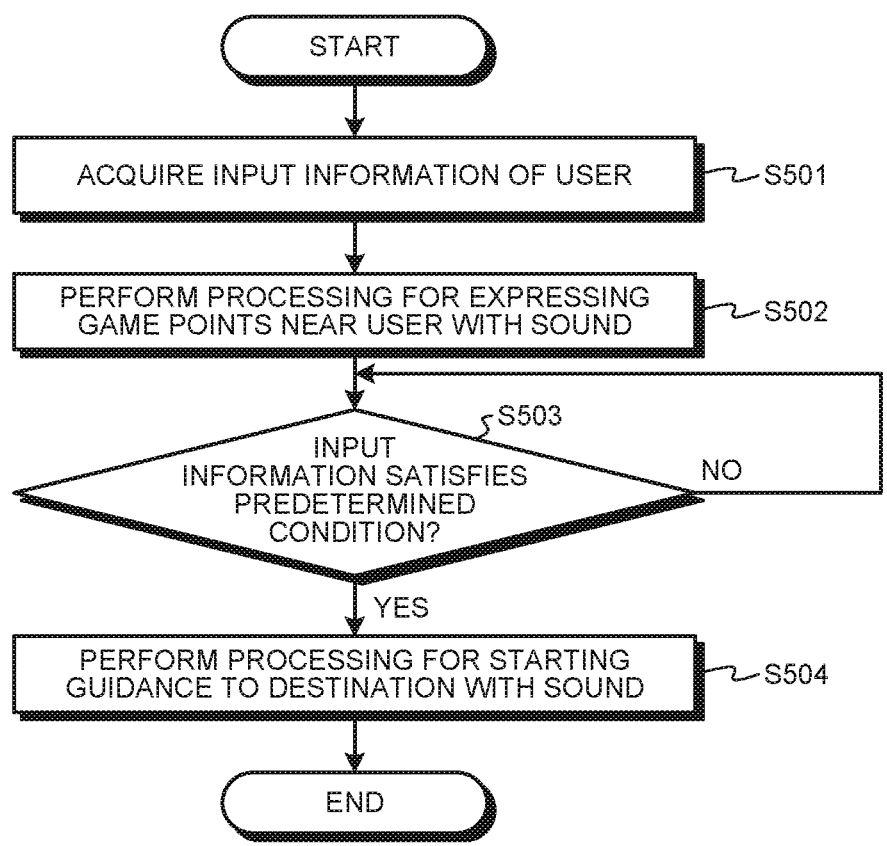
FIG. 25 is a flowchart illustrating a flow of processing of an example of a use case (amusement facility) in the information processing apparatus according to the embodiment.

FIG. 25 is a flowchart illustrating a flow of processing of the information processing apparatus 10 according to the embodiment in a case of guiding to a place where higher game points are acquired. The information processing apparatus 10 acquires indoor position information of the user as input information (S501). Next, the information processing apparatus 10 performs processing for expressing a game point acquisition place near the user with sound (S502). Specifically, the information processing apparatus 10 performs processing for expressing the height of the game points with sound. Then, the information processing apparatus 10 determines whether or not the input information based on the action of the user satisfies a predetermined condition (S503). For example, the information processing apparatus 10 determines whether or not a direction in which the user starts walking or a time for which the user directs his/her line of sight in a specific direction satisfies a predetermined condition. In a case where the information processing apparatus 10 determines that the input information based on the action of the user satisfies the predetermined condition (S504; YES), a process for starting guidance to the target game point acquisition place with sound is performed (S505). At this time, the information processing apparatus 10 may suppress output of sound related to other game point acquisition places near the user. Furthermore, in a case where the information processing apparatus 10 determines that the input information based on the action of the user does not satisfy the predetermined condition (S504; NO), the information processing apparatus 10 stands by until the input information based on the action of the user satisfies the predetermined condition.

(4) Use Case 4: Art Gallery/Museum

Figure 26:
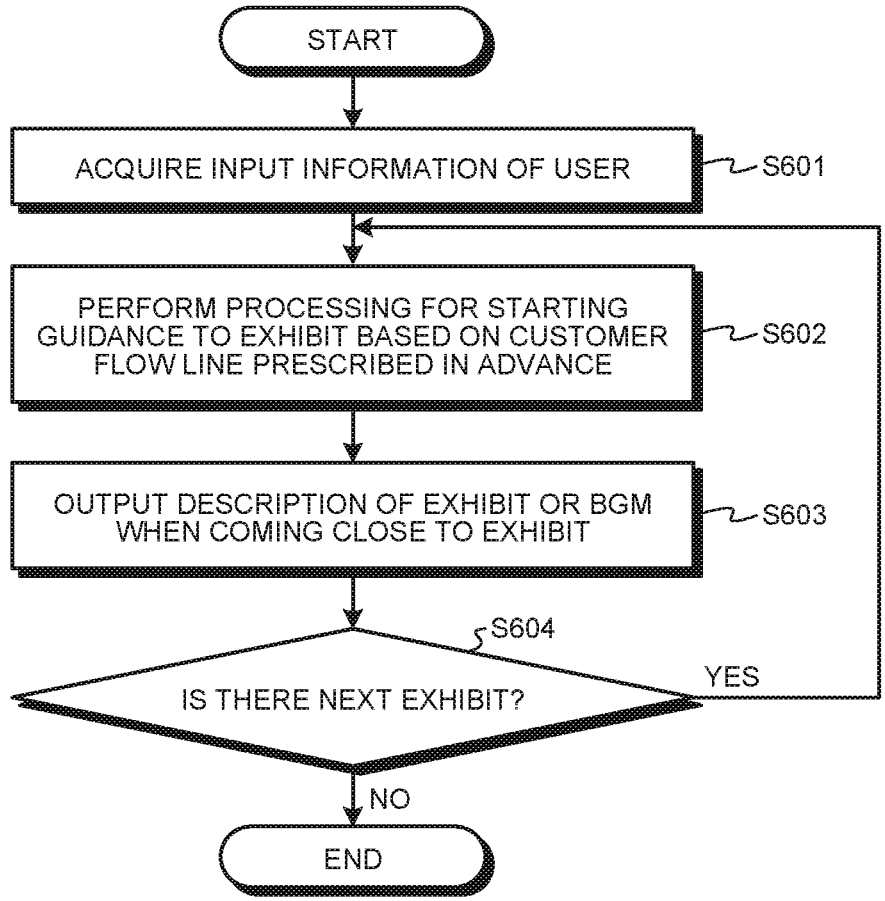
FIG. 26 is a flowchart illustrating a flow of processing of an example of a use case (art gallery/museum) in the information processing apparatus according to the embodiment.

FIG. 26 is a flowchart illustrating a flow of processing of the information processing apparatus 10 according to the embodiment in a case of guiding to an exhibit. The information processing apparatus 10 acquires information regarding a predetermined area in a building as input information (S601). For example, the information processing apparatus 10 acquires position information near a building entrance as input information. Next, the information processing apparatus 10 performs processing for starting guidance to an exhibit based on a customer flow line prescribed in advance (S602). Then, when the information processing apparatus 10 detects that the user has come close to the exhibit by using indoor or outdoor positioning such as the GPS or beacon, the information processing apparatus outputs a description of the exhibit or a BGM (S603). Then, when detecting that the user has moved out of a predetermined range from the exhibit, the information processing apparatus 10 determines whether there is a next exhibit (S604). In a case where the information processing apparatus 10 determines that there is no next exhibit (S604; NO), the information processing is terminated. Furthermore, in a case where the information processing apparatus 10 determines that there is a next exhibit (S604; YES), the process returns to step S602.

2.7. Variations of Processing

The embodiment of the present disclosure has been described above. Next, variations of processing of the embodiment of the present disclosure will be described. Note that variations of the processing described below may be applied to the embodiment of the present disclosure alone, or may be applied to the embodiment of the present disclosure in combination. Further, variations of the processing may be applied instead of the configuration described in the embodiment of the present disclosure, or may be additionally applied to the configuration described in the embodiment of the present disclosure.

(1) Processing Using Sound Source Group Including Plurality of Sound Sources In the above embodiment, the case where the information processing apparatus 10 performs the processing for expressing the sense of distance using the plurality of sound sources including one type of each of the first sound source and the second sound source has been described, but the present invention is not limited to this example. The information processing apparatus 10 may perform processing for expressing the sense of distance using a plurality of sound sources each including two or more types of sound sources of the first sound source and the second sound source. In this case, the information processing apparatus 10 classifies (groups) into a first sound source group including a plurality of first sound sources and a second sound source group including a plurality of second sound sources. At this time, the information processing apparatus 10 adjusts the ratio of each sound volume of the sound sources included in the sound source groups so that the sum of the sound volumes of the sound sources included in the same group becomes constant. For example, the information processing apparatus 10 equalizes the ratio of each sound volume of the sound sources included in the sound source group.

Figure 27A:
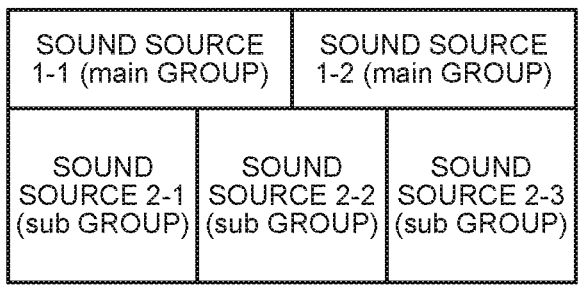
FIGS. 27A and 27B are diagrams illustrating ratios of sound volumes of sound sources included in sound source groups for expressing a sense of distance according to the embodiment.
Figure 27B:
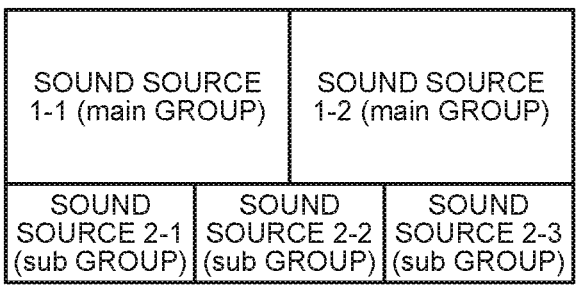

FIGS. 27A and 27B are diagrams illustrating an outline of a function for expressing a sense of distance of a candidate location with sound in a case where each of the first sound source and the second sound source includes a plurality of sound sources. Note that the same description as in FIGS. 6A and 6B will be omitted as appropriate. FIG. 27A illustrates a ratio of each sound volume of the first sound source and the second sound source and a ratio of sound volumes of a plurality of sound sources included in each of the first sound source and the second sound source in a case where a sense of distance is large. For example, the information processing apparatus 10 adjusts the ratios of the respective sound volumes such that the ratios of the sound volumes of the sound source 1-1 and the sound source 1-2, which are a plurality of sound sources included in the first sound source, become equivalent. Furthermore, for example, the information processing apparatus 10 adjusts the ratios of the respective sound volumes such that the ratios of the sound volumes of the sound sources 2-1 to 2-3, which are a plurality of sound sources included in the second sound source, become equivalent. FIG. 27B illustrates a ratio of each sound volume of the first sound source and the second sound source and a ratio of sound volumes of a plurality of sound sources included in each of the first sound source and the second sound source in a case where the sense of distance is small.

The generation unit 1122 generates sound data using a plurality of sound sources including a first sound source group including a plurality of first sound sources having the same sound volume and different from each other and a second sound source group in which the sum of the sound volumes has a predetermined relationship with the sum of the sound volumes of the first sound source group. Similarly, the generation unit 1122 generates sound data using a plurality of sound sources including a second sound source group including a plurality of second sound sources having the same sound volume and different from each other and a first sound source group in which the sum of the sound volumes has a predetermined relationship with the sum of the sound volumes of the second sound source group.

(2) Processing Using GUI Information

In the above embodiment, a case has been described in which the information processing apparatus 10 decides an index such as the density for guiding the user according to the attribute of the candidate location, and performs processing for expressing a search result based on the decided index with sound, but the present invention is not limited to this example. The information processing apparatus 10 may perform processing for expressing a search result based on an index set by the user with sound. For example, the information processing apparatus 10 may decide a plurality of indexes according to the attribute of the candidate location, and perform processing for expressing a search result based on the indexes set by the user operating (for example, a click or a tap) the decided indexes with sound.

Figure 28:
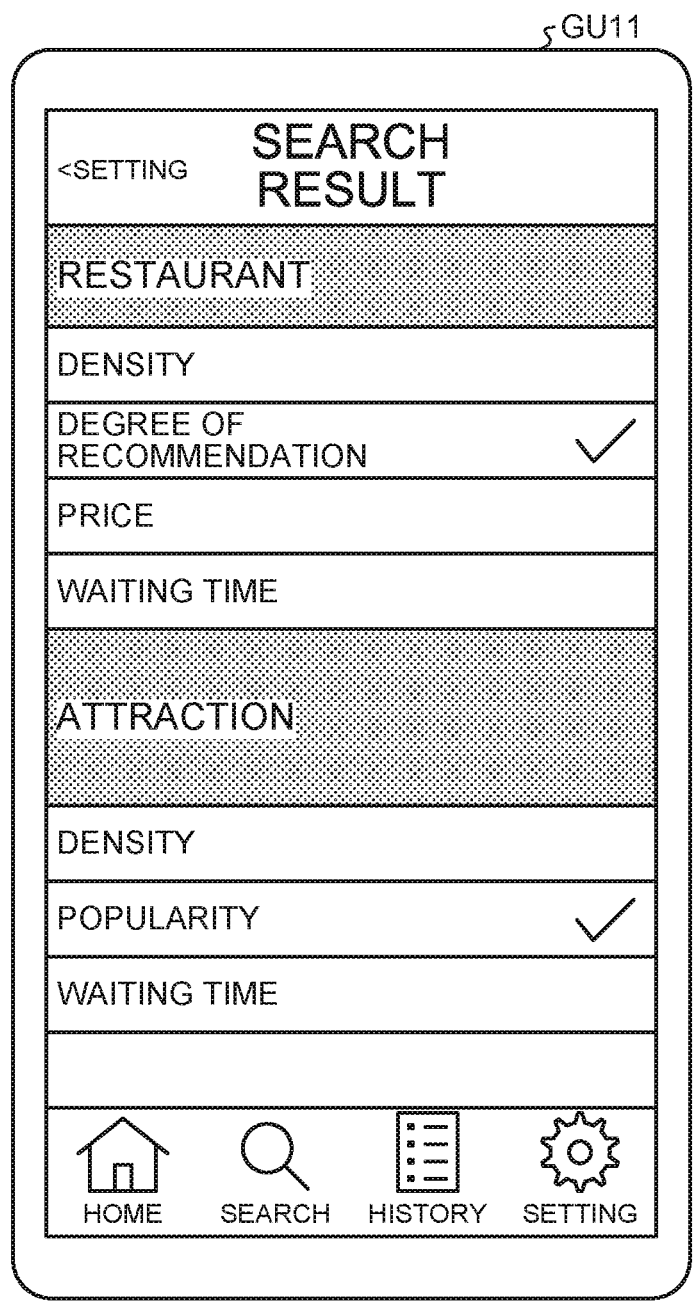
FIG. 28 is a diagram illustrating an example of GUI information according to the embodiment.

FIG. 28 illustrates an example of a display screen GU11 of the terminal device 30. Specifically, an example of GUI information in which the user can operate the indexes decided according to the attribute of the candidate location is illustrated. FIG. 28 illustrates a case where the user sets an index of the degree of recommendation for searching for a restaurant and sets an index of popularity for searching for an attraction. For example, when the user searches for a restaurant based on an index set in advance by the user, the information processing apparatus 10 performs processing for expressing a search result based on popularity with sound.

The output unit 113 provides GUI information operable by the user to the terminal device 30 via the communication unit 100, for example. For example, the output unit 113 provides GUI information capable of operating items such as density, degree of recommendation, price, popularity, waiting time, and the like decided as an index for guiding the user according to the attribute of the candidate location. Furthermore, the communication unit 300 outputs the GUI information received from the information processing apparatus 10 to the control unit 310. Furthermore, the output unit 320 outputs the GUI information provided from the information processing apparatus 10 via the communication unit 300.

(3) Processing Using Learner

In the above embodiment, the case where the information processing apparatus 10 decides the sound volume of the output sound based on the set value of the sound volume of the user has been described, but the present invention is not limited to this example. The information processing apparatus 10 may generate a learner that estimates the sound volume of the output sound of the user. Here, the processing unit 112 is not limited to the example illustrated in FIG. 12, and may include a learning unit 1125. The learning unit 1125 has a function of generating a learner that estimates the sound volume of the output sound of the user.

Figure 29:
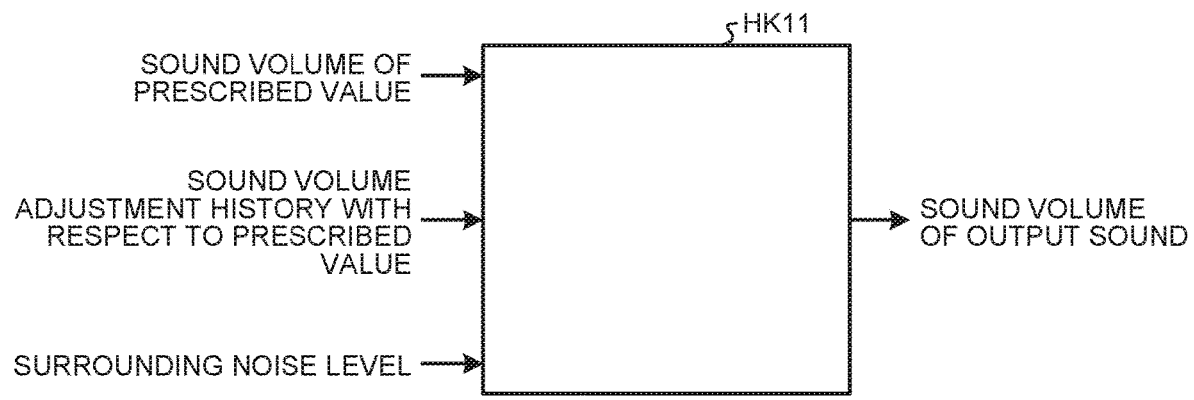
FIG. 29 is a diagram illustrating an outline of a learner according to the embodiment.

FIG. 29 illustrates an outline of processing of the learner. In FIG. 29, the sound volume of the prescribed value, the sound volume adjustment history of the user with respect to the prescribed value, and the noise level around the user are input information of the learner HK11, and the sound volume of the output sound of the user is output information of the learner HK11. When the sound volume of the prescribed value, the sound volume adjustment history of the user with respect to the prescribed value, and the noise level around the user are received, the learning unit 1125 generates the learner HK11 that estimates the sound volume of the output sound of the user. In addition, the learning unit 1125 learns the learner HK11 using the sound volume of the output sound actually set by the user as correct answer information.

Figure 30:
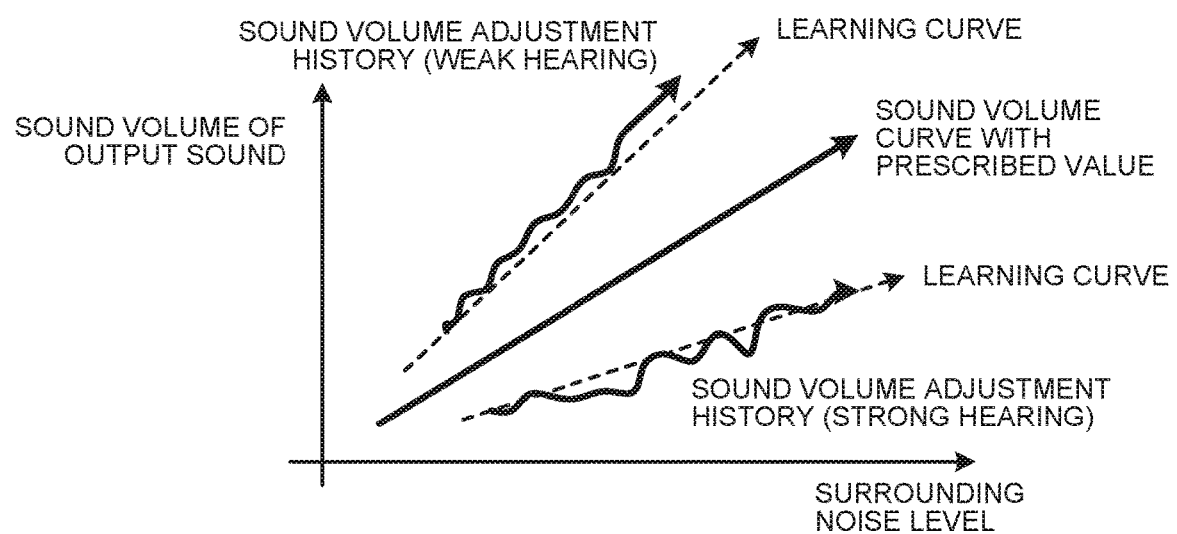
FIG. 30 is a diagram illustrating an example of a learning result by the learner according to the embodiment.

FIG. 30 illustrates an example of a learning result by the learner. Specifically, the relationship between the surrounding noise level and the sound volume of the output sound is illustrated. FIG. 30 illustrates a learning curve based on a sound volume adjustment history of a user with weak hearing and a learning curve based on a sound volume adjustment history of a user with strong hearing with respect to a sound volume curve with a prescribed value in which a sound volume with a prescribed value is plotted. A user with weak hearing has a large change in the sound volume of the output sound with respect to a change in the surrounding noise level. Meanwhile, a user with strong hearing has a small change in the sound volume of the output sound with respect to a change in the surrounding noise level. The information processing apparatus 10 may estimate the sound volume of the output sound of the user by generating a learning curve suitable for the hearing of each user based on the sound volume adjustment history of the user with respect to the prescribed value. Furthermore, the information processing apparatus 10 may estimate the sound volume of the output sound of the user by determining the hearing of the user based on the sound volume adjustment history of the user with respect to the prescribed value and selecting a learning curve suitable for the user.

(4) Limitation of Destination 1

In the above embodiment, the case where the destination according to the embodiment is a destination decided based on the search for the user has been described, but the present invention is not limited to this example. The destination according to the embodiment may be a destination decided based on any information of the user. For example, the destination according to the embodiment may be a destination decided based on a schedule registered in advance in the user's calendar.

(5) Limitation of Destination 2

In the above embodiment, for example, in a case where the destination of the user is an art gallery, the processing of the information processing apparatus 10 in a case where the user is guided to the art gallery and a case where the user is guided in the art gallery has been described. At this time, in the above-described embodiment, a case has been described where the information processing apparatus 10 performs processing for starting guidance by detecting either indoor or outdoor. Here, the information processing apparatus 10 may switch processing indoors or outdoors. For example, the information processing apparatus 10 may switch processing indoors and outdoors by detecting a transition of movement of the user indoors and outdoors. As a specific example, in a case where the destination of the user is an art gallery, the information processing apparatus 10 may switch the processing when the user approaches within a predetermined range from the art gallery. At this time, the information processing apparatus 10 may perform processing for expressing the sense of distance using different sound sources indoors and outdoors. For example, the information processing apparatus 10 may provide a service based on separate content included in the sound database indoors and outdoors.

3. Hardware Configuration Example

Figure 31:
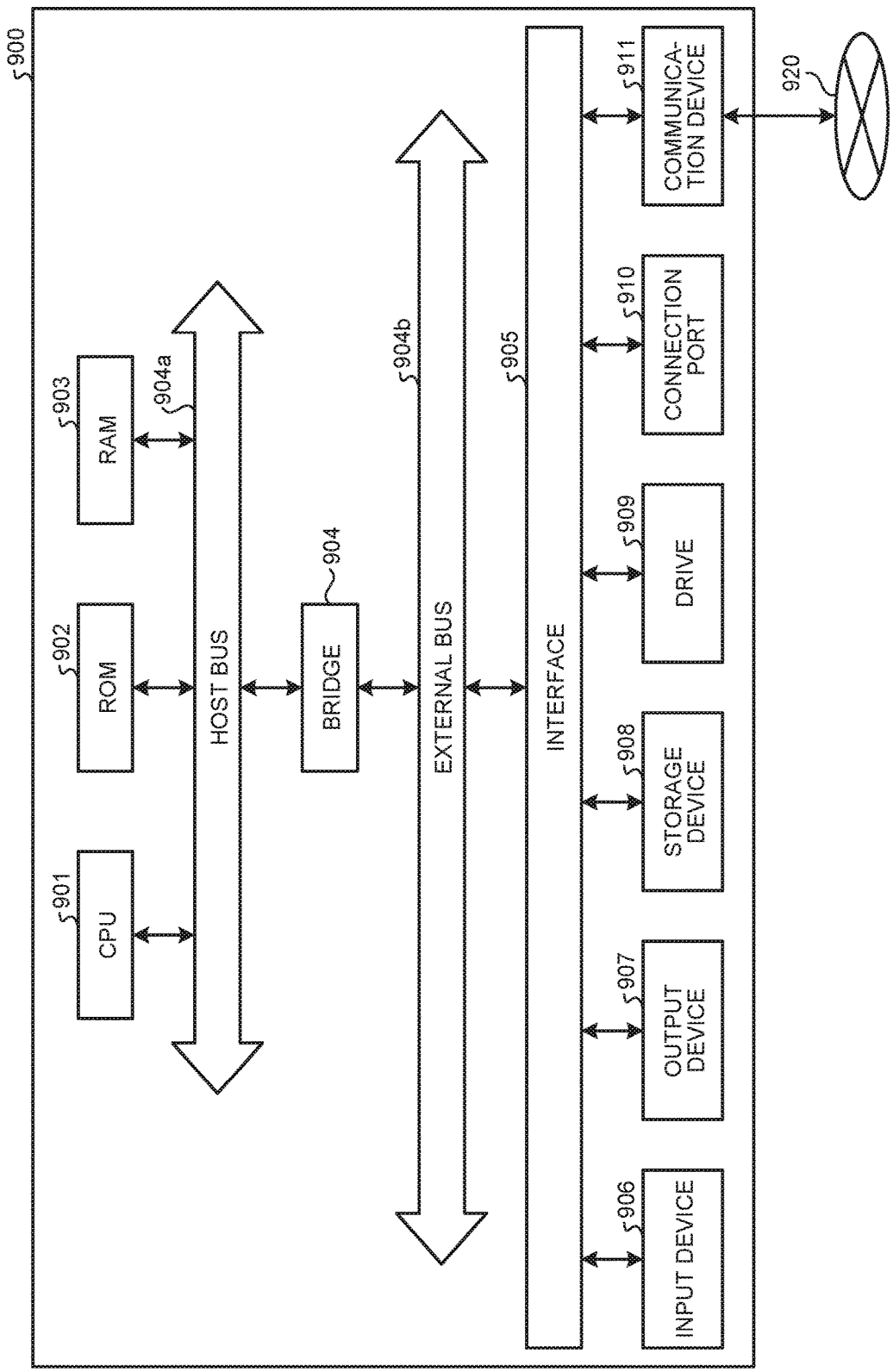
FIG. 31 is a diagram illustrating a hardware configuration example of the information processing apparatus according to the embodiment.

Finally, a hardware configuration example of the information processing apparatus according to the embodiment will be described with reference to FIG. 31. FIG. 31 is a block diagram illustrating a hardware configuration example of the information processing apparatus according to the embodiment. Note that an information processing apparatus 900 illustrated in FIG. 31 can implement, for example, the information processing apparatus 10, the audio processing device 20, and the terminal device 30 illustrated in FIG. 12. Information processing by the information processing apparatus 10, the audio processing device 20, and the terminal device 30 according to the embodiment is implemented by cooperation of software (configured by computer program) and hardware described below.

As illustrated in FIG. 31, the information processing apparatus 900 includes a central processing unit (CPU) 901, a read only memory (ROM) 902, and a random access memory (RAM) 903. Furthermore, the information processing apparatus 900 includes a host bus 904a, a bridge 904, an external bus 904b, an interface 905, an input device 906, an output device 907, a storage device 908, a drive 909, a connection port 910, and a communication device 911. Note that the hardware configuration illustrated here is an example, and some of the components may be omitted. In addition, the hardware configuration may further include components other than the components illustrated here.

The CPU 901 functions as, for example, an arithmetic processing device or a control device, and controls the overall operation of each component or a part thereof based on various computer programs recorded in the ROM 902, the RAM 903, or the storage device 908. The ROM 902 is a unit that stores a program read by the CPU 901, data used for calculation, and the like. The RAM 903 temporarily or permanently stores, for example, a program read by the CPU 901 and data (part of the program) such as various parameters that appropriately change when the program is executed. These are mutually connected by a host bus 904a including a CPU bus or the like. The CPU 901, the ROM 902, and the RAM 903 can implement the functions of the control unit 110, the control unit 210, and the control unit 310 described with reference to FIG. 12, for example, in cooperation with software.

The CPU 901, the ROM 902, and the RAM 903 are mutually connected via, for example, the host bus 904a capable of high-speed data transmission. Meanwhile, the host bus 904a is connected to the external bus 904b having a relatively low data transmission speed via the bridge 904, for example. Furthermore, the external bus 904b is connected to various components via the interface 905.

The input device 906 is implemented by, for example, a device to which information is input by a listener, such as a mouse, a keyboard, a touch panel, a button, a microphone, a switch, and a lever. In addition, the input device 906 may be, for example, a remote control device using infrared rays or other radio waves, or may be an external connection device such as a mobile phone or a PDA corresponding to the operation of the information processing apparatus 900. Furthermore, the input device 906 may include, for example, an input control circuit that generates an input signal based on information input using the above input means and outputs the input signal to the CPU 901. By operating the input device 906, the administrator of the information processing apparatus 900 can input various data to the information processing apparatus 900 and instruct the information processing apparatus 900 on processing operations.

In addition, the input device 906 can be formed by a device that detects the position of the user. For example, the input device 906 may include various sensors such as an image sensor (for example, a camera), a depth sensor (for example, a stereo camera), an acceleration sensor, a gyro sensor, a geomagnetic sensor, an optical sensor, a sound sensor, a distance measurement sensor (for example, a time of flight (ToF) sensor), and a force sensor. Furthermore, the input device 906 may acquire information regarding the state of the information processing apparatus 900 itself, such as the posture and moving speed of the information processing apparatus 900, and information regarding the surrounding space of the information processing apparatus 900, such as brightness and noise around the information processing apparatus 900. Furthermore, the input device 906 may include a global navigation satellite system (GNSS) module that receives a GNSS signal from a GNSS satellite (for example, a global positioning system (GPS) signal from a GPS satellite) and measures position information including the latitude, longitude, and altitude of the device. Furthermore, regarding the position information, the input device 906 may detect the position by transmission and reception with Wi-Fi (registered trademark), a mobile phone, a PHS, a smartphone, or the like, near field communication, or the like. The input device 906 can implement, for example, the functions of the acquisition unit 111 and the detection unit 1121 described with reference to FIG. 12.

The output device 907 is formed of a device capable of visually or aurally notifying the user of the acquired information. Examples of such a device include a display device such as a CRT display device, a liquid crystal display device, a plasma display device, an EL display device, a laser projector, an LED projector, and a lamp, a sound output device such as a speaker and a headphone, and a printer device. The output device 907 outputs, for example, results obtained by various types of processing performed by the information processing apparatus 900. Specifically, the display device visually displays results obtained by various processes performed by the information processing apparatus 900 in various formats such as text, images, tables, and graphs. On the other hand, the audio output device converts an audio signal including replayed audio data, acoustic data, or the like into an analog signal and aurally outputs the analog signal. The output device 907 can implement, for example, the functions of the output unit 113, the output unit 220, and the output unit 320 described with reference to FIG. 12.

The storage device 908 is a device for data storage formed as an example of a storage unit of the information processing apparatus 900. The storage device 908 is implemented by, for example, a magnetic storage device such as an HDD, a semiconductor storage device, an optical storage device, a magneto-optical storage device, or the like. The storage device 908 may include a storage medium, a recording device that records data in the storage medium, a reading device that reads data from the storage medium, a deletion device that deletes data recorded in the storage medium, and the like. The storage device 908 stores computer programs executed by the CPU 901, various data, various data acquired from the outside, and the like. The storage device 908 can implement, for example, the function of the storage unit 120 described with reference to FIG. 12.

The drive 909 is a reader/writer for a storage medium, and is built in or externally attached to the information processing apparatus 900. The drive 909 reads information recorded in a removable storage medium such as a mounted magnetic disk, optical disk, magneto-optical disk, or semiconductor memory, and outputs the information to the RAM 903. In addition, the drive 909 can also write information to a removable storage medium.

The connection port 910 is, for example, a port for connecting an external connection device such as a universal serial bus (USB) port, an IEEE 1394 port, a small computer system interface (SCSI), an RS-232C port, or an optical audio terminal.

The communication device 911 is, for example, a communication interface formed by a communication device or the like for connecting to the network 920. The communication device 911 is, for example, a communication card for wired or wireless local area network (LAN), long term evolution (LTE), Bluetooth (registered trademark), wireless USB (WUSB), or the like. In addition, the communication device 911 may be a router for optical communication, a router for asymmetric digital subscriber line (ADSL), a modem for various communications, or the like. For example, the communication device 911 can transmit and receive signals and the like to and from the Internet and other communication devices according to a predetermined protocol such as TCP/IP. The communication device 911 can implement, for example, the functions of the communication unit 100, the communication unit 200, and the communication unit 300 described with reference to FIG. 12.

Note that the network 920 is a wired or wireless transmission path of information transmitted from a device connected to the network 920. For example, the network 920 may include a public network such as the Internet, a telephone network, or a satellite communication network, various local area networks (LANs) including Ethernet (registered trademark), a wide area network (WAN), or the like. In addition, the network 920 may include a dedicated line network such as an Internet protocol-virtual private network (IP-VPN).

An example of the hardware configuration capable of implementing the functions of the information processing apparatus 900 according to the embodiment has been described above. Each of the above-described components may be implemented using a general-purpose member, or may be implemented by hardware specialized for the function of each component. Therefore, it is possible to appropriately change the hardware configuration to be used according to the technical level at the time of implementing the embodiment.

4. Summary

As described above, the information processing apparatus 10 according to the embodiment performs processing of generating sound data for expressing a sense of distance from a current location of a user to a candidate location that can be a destination using a plurality of sound sources. As a result, the information processing apparatus 10 can appropriately express the distribution of candidate locations that are likely to be targets in a specific direction, for example, by adjusting the tempo of the output sound.

Therefore, it is possible to provide a new and improved information processing apparatus, information processing method, information processing program, and audio processing device capable of promoting further improvement in usability.

Although the preferred embodiment of the present disclosure has been described in detail with reference to the accompanying drawings, the technical scope of the present disclosure is not limited to such examples. It is obvious that a person having ordinary knowledge in the technical field of the present disclosure can conceive various changes or modifications within the scope of the technical idea described in the claims, and it is naturally understood that these also belong to the technical scope of the present disclosure.

For example, each device described in the present specification may be implemented as a single device, or some or all of the devices may be implemented as separate devices. For example, the information processing apparatus 10, the audio processing device 20, and the terminal device 30 illustrated in FIG. 12 may be implemented as independent devices. Furthermore, for example, it may be implemented as a server device connected to the information processing apparatus 10, the audio processing device 20, and the terminal device 30 via a network or the like. Furthermore, the function of the control unit 110 included in the information processing apparatus 10 may be included in a server device connected via a network or the like.

Furthermore, the series of processing by each device described in the present specification may be implemented using any of software, hardware, and a combination of software and hardware. The computer program constituting the software is stored in advance in, for example, a recording medium (non-transitory medium) provided inside or outside each device. Then, each program is read into the RAM at the time of execution by the computer, for example, and is executed by a processor such as a CPU.

Furthermore, the processing described using the flowchart in the present specification may not necessarily be executed in the illustrated order. Some processing steps may be performed in parallel. In addition, additional processing steps may be employed, and some processing steps may be omitted.

Furthermore, the effects described in the present specification are merely illustrative or exemplary, and are not restrictive. That is, the technique according to the present disclosure can exhibit other effects obvious to those skilled in the art from the description of the present specification together with or instead of the above effects.

Note that the following configurations also belong to the technical scope of the present disclosure.

(1)

An information processing apparatus comprising:
an acquisition unit configured to acquire information regarding at least one candidate location;
a generation unit configured to generate sound data for expressing a sense of distance from a current location of a user to the candidate location acquired by the acquisition unit using a plurality of sound sources; and
an output unit configured to output the sound data generated by the generation unit to the plurality of sound sources.

(2)

The information processing apparatus according to (1), wherein
the generation unit generates the sound data for expressing the sense of distance by adjusting a ratio of a sound volume of each of the plurality of sound sources.

(3)

The information processing apparatus according to (1) or (2), wherein
the generation unit generates sound data for expressing a sense of orientation to the candidate location by adjusting sound volumes of left and right output by the output unit.

(4)

The information processing apparatus according to (3), wherein
the generation unit generates the sound data for expressing the sense of orientation without changing a ratio of a sound volume of each of the plurality of sound sources included in each of the left and right.

(5)

The information processing apparatus according to any one of (1) to (4), wherein
the generation unit generates sound data for expressing a density of candidate locations by adjusting an acoustic characteristic of sound output by the output unit.

(6)

The information processing apparatus according to (5), wherein
the acoustic characteristic is a tempo or a pitch of the sound.

(7)

The information processing apparatus according to (5) or (6), wherein
the generation unit generates the sound data for outputting the sound with the acoustic characteristic decided based on a relationship between the density and the acoustic characteristic.

(8)

The information processing apparatus according to any one of (5) to (7), wherein
the generation unit generates the sound data for outputting the sound with the acoustic characteristic in which the acoustic characteristic during output is changed according to the density when the sound is being output.

(9)

The information processing apparatus according to any one of (5) to (7), wherein
the generation unit generates the sound data for outputting the sound with the acoustic characteristic in which the acoustic characteristic prescribed in advance is changed according to the density when the sound is not being output.

(10)

The information processing apparatus according to any one of (1) to (9), further comprising
  a decision unit configured to decide a candidate location selected by the user from among the candidate location, wherein
  the generation unit generates the sound data for outputting sound according to the candidate location decided by the decision unit.

(11)

The information processing apparatus according to (10), wherein
  the decision unit repeats processing by the decision unit until the number of candidate locations selected by the user falls below a predetermined threshold when the number of candidate locations is equal to or greater than the predetermined threshold.

(12)

The information processing apparatus according to any one of (1) to (11), wherein
  the generation unit generates the sound data using a plurality of sound sources according to an attribute of the candidate location.

(13)

The information processing apparatus according to any one of (1) to (12), wherein
  the generation unit generates the sound data such that an output sound volume does not become equal to or less than a predetermined threshold.

(14)

The information processing apparatus according to (13), wherein
  the generation unit generates the sound data for outputting sound with a sound volume decided not to be equal to or less than the predetermined threshold based on a relationship between output sound volume and a set value of the user.

(15)

The information processing apparatus according to (13) or (14), wherein
  the generation unit generates the sound data for outputting sound with a sound volume not to be equal to or less than the predetermined threshold decided according to a noise level around the user.

(16)

The information processing apparatus according to any one of (1) to (15), wherein
  the generation unit generates the sound data using the plurality of sound sources including a first sound source according to an attribute of the candidate location and a second sound source different from the first sound source.

(17)

The information processing apparatus according to (16), wherein
  the generation unit generates the sound data for outputting sound with a ratio of a sound volume of each of the first sound source and the second sound source decided according to at least one of a moving situation of the user, a moving means, and a distance to the candidate location.

(18)

The information processing apparatus according to (16) or (17), wherein
  the generation unit generates the sound data using the plurality of sound sources including a first sound source group including a plurality of the first sound sources having a same sound volume and different from each other and a second sound source group in which a sum of sound volumes has a predetermined relationship with a sum of sound volumes of the first sound source group.

(19)

The information processing apparatus according to any one of (16) to (18), wherein
  the generation unit generates the sound data using the plurality of sound sources including a second sound source group including a plurality of the second sound sources having a same sound volume and different from each other and a first sound source group in which a sum of sound volumes has a predetermined relationship with a sum of sound volumes of the second sound source group.

(20)

The information processing apparatus according to any one of (16) to (19), wherein
  the generation unit generates the sound data corresponding to an item of the candidate location based on an operation of the user on the item according to the attribute of the candidate location.

(21)

The information processing apparatus according to any one of (1) to (20), further comprising
  a learning unit configured to estimate a sound volume of an output sound of the user based on a noise level around the user, wherein
  the generation unit generates the sound data based on a learning result in the learning unit.

(22)

The information processing apparatus according to (21), wherein
  the learning unit learns, as input information, information regarding a prescribed value of a sound volume prescribed in advance, information regarding a set value of a sound volume set by the user in the past for the prescribed value, and a noise level around the user when the set value is set.

(23)

The information processing apparatus according to any one of (1) to (22), wherein
  the acquisition unit acquires information regarding the candidate location as a target as a search result based on an input of the user.

(24)

An information processing method executed by a computer, the information processing method comprising the steps of:
  acquiring information regarding at least one candidate location;
  generating sound data for expressing a sense of distance from a current location of a user to the candidate location acquired by the acquiring using a plurality of sound sources; and
  outputting the sound data generated by the generating to the plurality of sound sources.

(25)

An information processing program causing a computer to execute:
  an acquisition procedure for acquiring information regarding at least one candidate location;

a generation procedure for generating sound data for expressing a sense of distance from a current location of a user to the candidate location acquired by the acquisition procedure using a plurality of sound sources; and an output procedure for outputting the sound data generated by the generation procedure to the plurality of sound sources.

(26)

An audio processing device comprising an output unit configured to output sound based on sound data provided from an information processing apparatus, wherein the information processing apparatus provides sound data generated for expressing a sense of distance to a candidate location that can be a destination of a user from a current value of the user using a plurality of sound sources.

REFERENCE SIGNS LIST

1 INFORMATION PROCESSING SYSTEM
10 INFORMATION PROCESSING APPARATUS
20 AUDIO PROCESSING DEVICE
30 TERMINAL DEVICE
100 COMMUNICATION UNIT
110 CONTROL UNIT
111 ACQUISITION UNIT
112 PROCESSING UNIT
1121 DETECTION UNIT
1122 GENERATION UNIT
1123 DECISION UNIT
1124 DETERMINATION UNIT
1125 LEARNING UNIT
113 OUTPUT UNIT
200 COMMUNICATION UNIT
210 CONTROL UNIT
220 OUTPUT UNIT
300 COMMUNICATION UNIT
310 CONTROL UNIT
320 OUTPUT UNIT

The invention claimed is:

1. An information processing apparatus, comprising:
circuitry configured to:
acquire information regarding at least one candidate location;
generate sound data to express a sense of distance from a current location of a user to the at least one candidate location using a plurality of sound sources, wherein
the generation of the sound data to express the sense of distance includes adjustment of a ratio of a sound volume of each sound source of the plurality of sound sources; and
output the generated sound data to an audio processing device.

2. The information processing apparatus according to claim 1, wherein the circuitry is further configured to generate the sound data to express a sense of orientation to the at least one candidate location by adjustment of sound volumes of an output sound on a left side and the output sound on a right side corresponding to the sound data.

3. The information processing apparatus according to claim 2, wherein the circuitry is further configured to generate the sound data to express the sense of orientation without a change in the ratio of the sound volume of each sound source of the plurality of sound sources in each of the output sound on the left side and the output sound on the right side.

4. The information processing apparatus according to claim 1, wherein
the circuitry is further configured to generate the sound data to express a density of candidate locations by adjustment of an acoustic characteristic of an output sound corresponding to the sound data, and
the candidate locations include the at least one candidate location.

5. The information processing apparatus according to claim 4, wherein the acoustic characteristic includes a tempo or a pitch of the output sound.

6. The information processing apparatus according to claim 4, wherein the circuitry is further configured to:
determine the acoustic characteristic decided based on a relationship between the density and the acoustic characteristic; and
generate the sound data for the output sound with the determined acoustic characteristic.

7. The information processing apparatus according to claim 4, wherein the circuitry is further configured to generate the sound data for the output sound with the acoustic characteristic in which the acoustic characteristic is changed according to the density during output of the output sound.

8. The information processing apparatus according to claim 4, wherein the circuitry is further configured to generate the sound data for the output sound with the acoustic characteristic in which the acoustic characteristic prescribed in advance is changed according to the density.

9. The information processing apparatus according to claim 1, wherein the circuitry is further configured to:
determine the at least one candidate location selected by the user from among candidate locations; and
generate the sound data for output sound according to the determined at least one candidate location.

10. The information processing apparatus according to claim 9, wherein the circuitry is further configured to repeat the determination of the at least one candidate location until a number of the candidate locations selected by the user falls below a threshold in a case where the number of the candidate locations is equal to or greater than the threshold.

11. The information processing apparatus according to claim 1, wherein the circuitry is further configured to generate the sound data using the plurality of sound sources according to an attribute of the at least one candidate location.

12. The information processing apparatus according to claim 1, wherein the circuitry is further configured to generate the sound data such that an output sound volume does not become equal to or less than a determined threshold.

13. The information processing apparatus according to claim 12, wherein the circuitry is further configured to:
determine the output sound volume not to be equal to or less than the determined threshold based on a relationship between the output sound volume and a set value of the user.

14. The information processing apparatus according to claim 12, wherein the circuitry is further configured to determine the output sound volume not to be equal to or less than the determined threshold according to a noise level around the user.

15. The information processing apparatus according to claim 1, wherein the circuitry is further configured to generate the sound data using the plurality of sound sources including a first sound source according to an attribute of the at least one candidate location and a second sound source different from the first sound source.

16. The information processing apparatus according to claim 15, wherein the circuitry is further configured to generate the sound data for an output sound with the ratio of the sound volume of each of the first sound source and the second sound source according to at least one of a moving situation of the user, a moving means, or the distance to the at least one candidate location.

17. The information processing apparatus according to claim 15, wherein the plurality of sound sources includes:
a first sound source group including a plurality of different first sound sources having a same sound volume, and
a second sound source group in which a sum of sound volumes has a determined relationship with a sum of sound volumes of the first sound source group.

18. The information processing apparatus according to claim 15, wherein the plurality of sound sources includes:
a second sound source group including a plurality of different second sound sources having a same sound volume, and
a first sound source group in which a sum of sound volumes has a determined relationship with a sum of sound volumes of the second sound source group.

19. The information processing apparatus according to claim 15, wherein the circuitry is further configured to generate the sound data corresponding to an item of the at least one candidate location based on an operation of the user on the item according to the attribute of the at least one candidate location.

20. The information processing apparatus according to claim 1, wherein the circuitry is further configured to:
estimate, by a learning process, a sound volume of an output sound of the user based on a noise level around the user; and
generate the sound data based on a learning result of the learning process.

21. The information processing apparatus according to claim 20, wherein the circuitry is further configured to learn, as input information, information regarding a prescribed value of the sound volume prescribed in advance, information regarding a set value of the sound volume set by the user in a past for the prescribed value, and the noise level around the user in a case where the set value is set.

22. The information processing apparatus according to claim 1, wherein the circuitry is further configured to acquire information regarding the at least one candidate location as a search result.

23. An information processing method executed by a computer, the information processing method comprising:
acquiring information regarding at least one candidate location;
generating sound data to express a sense of distance from a current location of a user to the at least one candidate location using a plurality of sound sources, wherein
the generation of the sound data to express the sense of distance includes adjustment of a ratio of a sound volume of each sound source of the plurality of sound sources; and
outputting the generated sound data to an audio processing device.

24. A non-transitory computer-readable medium having stored thereon, computer executable instructions which, when executed by a computer, cause the computer to execute operations, the operations comprising:
acquiring information regarding at least one candidate location;
generating sound data to express a sense of distance from a current location of a user to the at least one candidate location using a plurality of sound sources, wherein
the generation of the sound data to express the sense of distance includes adjustment of a ratio of a sound volume of each sound source of the plurality of sound sources; and
outputting the generated sound data to an audio processing device.

25. An audio processing device, comprising:
at least one speaker configured to output sound based on sound data output from an information processing apparatus, wherein
the information processing apparatus generates the sound data to express a sense of distance to a candidate location from a current location of a user using a plurality of sound sources, and
the output of the sound corresponding to the sound data to express the sense of distance includes adjustment of a ratio of a sound volume of each sound source of the plurality of sound sources.

* * * * *